(12) United States Patent
Huh et al.

(10) Patent No.: US 11,659,732 B2
(45) Date of Patent: May 23, 2023

(54) DISPLAY DEVICE AND FABRICATION METHOD THEREOF

(71) Applicant: Samsung Display Co., Ltd., Yongin-si (KR)

(72) Inventors: Su Jung Huh, Yongin-si (KR); Soo Min Baek, Yongin-si (KR); Ji Won Lee, Yongin-si (KR); Ju Hwa Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 17/357,815

(22) Filed: Jun. 24, 2021

(65) Prior Publication Data

US 2021/0320280 A1 Oct. 14, 2021

Related U.S. Application Data

(62) Division of application No. 16/544,208, filed on Aug. 19, 2019, now Pat. No. 11,069,880.

(30) Foreign Application Priority Data

Oct. 15, 2018 (KR) .................. 10-2018-0122784

(51) Int. Cl.
*H01L 51/52* (2006.01)
*G02F 1/1337* (2006.01)
(Continued)

(52) U.S. Cl.
CPC ........ *H01L 51/5275* (2013.01); *G02F 1/1334* (2013.01); *G02F 1/1337* (2013.01);
(Continued)

(58) Field of Classification Search
None
See application file for complete search history.

(56) References Cited

U.S. PATENT DOCUMENTS

| 7,408,601 B1 | 8/2008 | Huang et al. |
| 10,008,043 B2 | 6/2018 | Luebke et al. |

(Continued)

FOREIGN PATENT DOCUMENTS

JP 2009-128664 A 6/2009

OTHER PUBLICATIONS

EPO Extended Search Report dated Apr. 8, 2020, for corresponding European Patent Application No. 19203414.8 (5 pages).

(Continued)

*Primary Examiner* — Telly D Green
(74) *Attorney, Agent, or Firm* — Lewis Roca Rothgerber Christie LLP

(57) ABSTRACT

A display device may include a display configured to emit light for displaying an image, a microlens array on the display and configured to collimate the image incident from the display so as to be delivered to the eyes of a user, the microlens array including a refractive index conversion layer in which a refractive index varies from region to region, and an optical path adjustment layer configured to collect light, emitted from the display and transmitted by the microlens array, and to space the display and the microlens array a preset distance apart from each other. Here, the refractive index conversion layer may include a polymer and liquid crystal molecules that interact with the polymer.

16 Claims, 14 Drawing Sheets

(51) Int. Cl.
  *G02F 1/1334* (2006.01)
  *H01L 51/56* (2006.01)
  *H01L 27/32* (2006.01)
  *G02F 1/1343* (2006.01)
  *G06F 1/16* (2006.01)

(52) U.S. Cl.
  CPC .......... *G02F 1/13439* (2013.01); *G06F 1/163* (2013.01); *H01L 27/3232* (2013.01); *H01L 27/3244* (2013.01); *H01L 51/5253* (2013.01); *H01L 51/56* (2013.01); *G02F 1/13345* (2021.01); *H01L 2227/323* (2013.01)

(56) References Cited

U.S. PATENT DOCUMENTS

| | | | |
|---|---|---|---|
| 10,139,669 | B2 | 11/2018 | Tateno et al. |
| 10,298,915 | B2 | 5/2019 | Huh et al. |
| 10,718,944 | B2 | 7/2020 | Chuang et al. |
| 2015/0042926 | A1 | 2/2015 | Akasaka |
| 2015/0277187 | A1 | 10/2015 | Akasaka |
| 2016/0109752 | A1 | 4/2016 | Tateno et al. |
| 2016/0223817 | A1 | 8/2016 | Kizu et al. |
| 2017/0147034 | A1 | 5/2017 | Lanman et al. |
| 2018/0124384 | A1 | 5/2018 | Huh et al. |
| 2018/0149871 | A1 | 5/2018 | Chuang et al. |
| 2018/0267358 | A1 | 9/2018 | Choi et al. |
| 2019/0230343 | A1 | 7/2019 | Huh et al. |

OTHER PUBLICATIONS

Lanman, Douglas et al.; "Near-Eye Light Field Displays"; ACM Transactions on Graphics (TOG); vol. 32; Issue 6; Nov. 2013; (Proceedings of SIGGRAPH Asia); 10pp.

DISPLAY DEVICE AND FABRICATION METHOD THEREOF

CROSS-REFERENCE TO RELATED APPLICATIONS

This application is a divisional of U.S. patent application Ser. No. 16/544,208, filed Aug. 19, 2019, which claims priority to and the benefit of Korean Patent Application No. 10-2018-0122784, filed Oct. 15, 2018, the entire content of both of which is incorporated herein by reference.

BACKGROUND

1. Field

Aspects of some example embodiments of the present disclosure relate to a display device and a fabrication method thereof.

2. Related Art

Recently, various types of electronic devices that are capable of being worn on the body have been developed. These devices are referred to as "wearable electronic devices".

As an example of wearable electronic devices, a Head Mounted Display device (hereinafter, referred to as an "HMD") may be used for various purposes, including watching movies and the like, because an HMD may be capable of displaying a vivid image and providing high immersion.

The above information in the Background section is only for enhancement of understanding of the background of the technology and therefore it should not be construed as admission of existence or relevancy of the prior art.

SUMMARY

Aspects of some example embodiments of the present disclosure are related to a slim display device having improved display quality.

Also, some example embodiments of the present disclosure are related to a method for fabricating a slim display device having improved display quality.

According to some example embodiments of the present disclosure, a display device may a display part configured to emit light for displaying an image; a microlens array on the display part and configured to collimate the image incident from the display part so as to be delivered to eyes of a user, the microlens array including a refractive index conversion layer in which a refractive index varies from region to region; and an optical path adjustment layer configured to collect the light, emitted from the display part and transmitted by the microlens array, and to space the display part and the microlens array a preset distance apart from each other. Here, the refractive index conversion layer may include a polymer and liquid crystal molecules that interact with the polymer.

In some example embodiments of the present disclosure, the polymer may include a polymer network that is formed in such a way that UV-curable monomers react to ultraviolet light.

In some example embodiments of the present disclosure, in the refractive index conversion layer, the content of the polymer network may be equal to or higher than 0.01%.

In some example embodiments of the present disclosure, the refractive index conversion layer may include at least one lens shape that is formed by the polymer network and the liquid crystal molecules.

In some example embodiments of the present disclosure, the refractive index conversion layer may further include an additive material for arrangement of the liquid crystal molecules. Here, the additive material may include an alignment material.

In some example embodiments of the present disclosure, the microlens array may further include an upper electrode on the refractive index conversion layer and a lower electrode under the refractive index conversion layer so as to face the upper electrode. Each of the upper electrode and the lower electrode may include a transparent conductive material.

In some example embodiments of the present disclosure, the optical path adjustment layer may be between the display part and the microlens array.

In some example embodiments of the present disclosure, the optical path adjustment layer may include any one of a silicon-based material, an optically transparent adhesive material, and a transparent optical resin.

In some example embodiments of the present disclosure, the display part may include a substrate including a display area and a non-display area, the display area being configured to display the image and the non-display area being configured to surround at least one side of the display area; a pixel circuit on the substrate and including at least one transistor; and a display element layer including at least one light-emitting element that is electrically coupled to the transistor and configured to emit the light.

In some example embodiments of the present disclosure, the display device may further include an encapsulation layer between the display part and the optical path adjustment layer.

In some example embodiments of the present disclosure, the encapsulation layer may include any one of an encapsulation substrate and a thin encapsulation film, each of which is configured to cover the display element layer.

In some example embodiments of the present disclosure, the display device may further include a protective layer between the optical path adjustment layer and the microlens array and configured to cover the optical path adjustment layer.

The display device according to some example embodiments may be fabricated through a method that includes forming a display part configured to emit light for displaying an image; and forming a microlens array including a refractive index conversion layer, in which a refractive index varies from region to region, on the display part.

Forming the microlens array may include forming a lower electrode, made of a transparent conductive material, on the display part; coating the lower electrode with a mixture layer in which UV-curable monomers and liquid crystal molecules are mixed; forming an upper electrode, made of the same material as the lower electrode, on the mixture layer; and arranging a mask on the upper electrode and radiating ultraviolet light to the mixture layer, thereby forming the refractive index conversion layer including a polymer network, crosslinked by the ultraviolet light, and the liquid crystal molecules interacting with the polymer network.

In some example embodiments of the present disclosure, in the refractive index conversion layer, the content of the polymer network may be equal to or higher than 0.01%.

In some example embodiments of the present disclosure, the mask may include multiple openings through which the ultraviolet light passes such that the ultraviolet light reaches the refractive index conversion layer. Each of the openings may include any one of a dot shape and a ring shape. Here, the multiple openings may have different sizes.

In some example embodiments of the present disclosure, in the refractive index conversion layer, the density of the polymer network may vary depending on the amount of the radiated ultraviolet light.

In some example embodiments of the present disclosure, the density of the polymer network in a region to which a large amount of the ultraviolet light is radiated may be higher than that in a region to which a small amount of the ultraviolet light is radiated.

In some example embodiments of the present disclosure, in the refractive index conversion layer, the liquid crystal molecules may be intensively distributed in the region in which the density of the polymer network is high.

In some example embodiments of the present disclosure, the liquid crystal molecules and the polymer network, the densities of which vary from region to region, may form a lens shape in the refractive index conversion layer.

In some example embodiments of the present disclosure, the refractive index conversion layer may be configured such that a refractive index in a region in which the densities of the polymer network and the liquid crystal molecules are high is higher than that in a region in which the densities of the polymer network and the liquid crystal molecules are low.

In some example embodiments of the present disclosure, the refractive index conversion layer may further include an additive material for arrangement of the liquid crystal molecules. Here, the additive material may include an alignment material.

In some example embodiments of the present disclosure, the method for fabricating the display device may further include forming an optical path adjustment layer on the display part, the optical path adjustment layer being configured to collect light, emitted from the display part and transmitted by the microlens array, and to space the display part and the microlens array a preset distance apart from each other.

In some example embodiments of the present disclosure, the optical path adjustment layer may be formed between the display part and the microlens array.

In some example embodiments of the present disclosure, the optical path adjustment layer may include any one of a silicon-based material, an optically transparent adhesive material, and a transparent optical resin.

In some example embodiments of the present disclosure, the display part may include a substrate including a display area and a non-display area, the display area being configured to display the image and the non-display area being configured to surround at least one side of the display area; a pixel circuit on the substrate and including at least one transistor; and a display element layer including at least one light-emitting element that is electrically coupled to the transistor and configured to emit the light.

In some example embodiments of the present disclosure, the method for fabricating the display device may further include forming an encapsulation layer between the display part and the optical path adjustment layer. Here, the encapsulation layer may include any one of an encapsulation substrate and a thin encapsulation film, each of which is configured to cover the display element layer.

In some example embodiments of the present disclosure, the method for fabricating the display device may further include forming a protective layer between the optical path adjustment layer and the microlens array.

DETAILED DESCRIPTION

Figure 1:
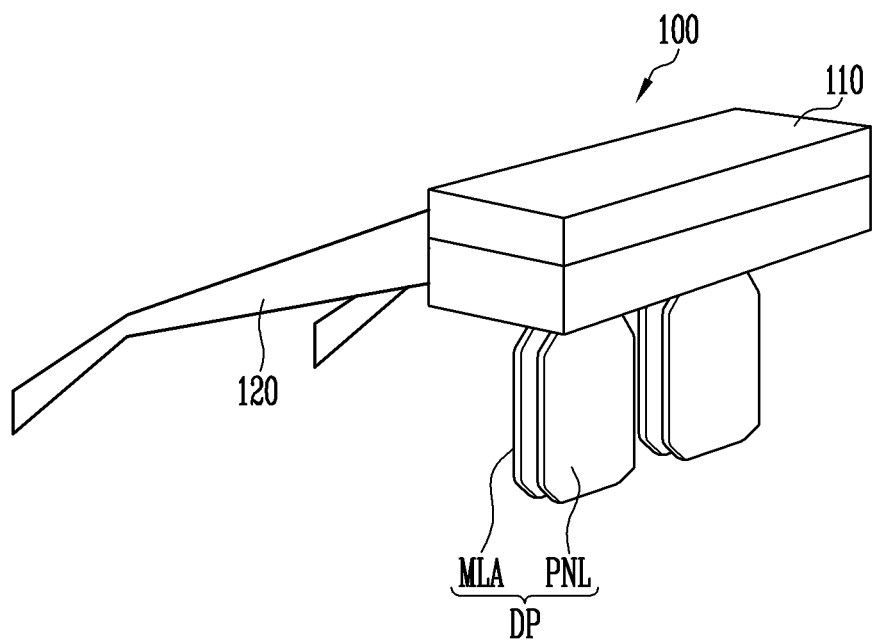
FIG. 1 is a perspective view illustrating that a display device including a microlens array is applied in a wearable electronic device according to some example embodiments.

Because embodiments of the present disclosure may be variously changed and may have various embodiments, some example embodiments will be described in some detail below with reference to the attached drawings. However, it should be understood that those embodiments are not intended to limit the present disclosure to the specific disclosed embodiments, and embodiments according to the present disclosure include all changes, equivalents, or modifications included in the spirit and scope of the present disclosure.

Like reference numerals in the drawings denote like elements. In the drawings, lengths and sizes of layers and regions may be exaggerated for clarity. Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, a singular form may include a plural from as long as it is not specifically mentioned in a sentence.

In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added. Furthermore, when a first part such as a layer, a film, a region, or a plate is on a second part, the first part may be not only directly on the second part but a third part may intervene between them. Furthermore, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the second part may be not only directly under the first part but a third part may intervene between them.

Hereinafter, aspects of some example embodiments of the present disclosure will be described in more detail with reference to the accompanying drawings.

Figure 2:
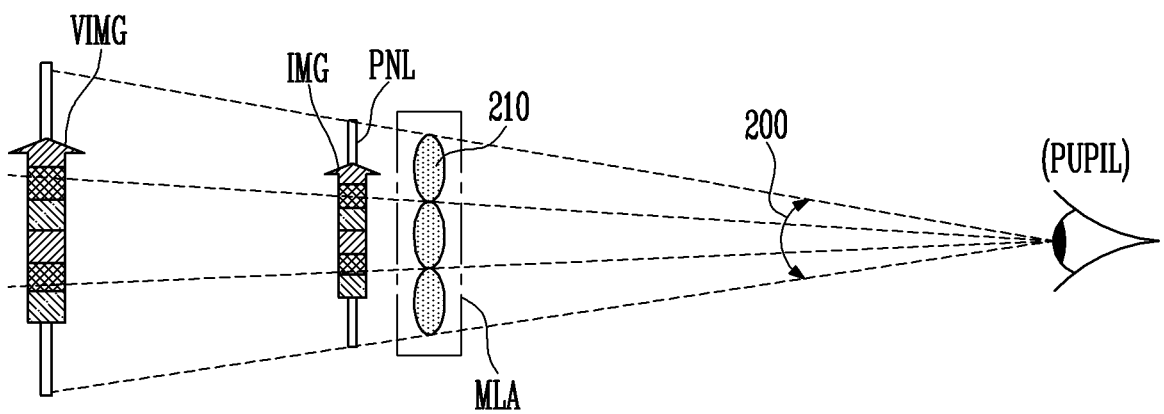
FIG. 2 is a side view schematically illustrating that a virtual image is created in the wearable electronic device shown in FIG. 1.

FIG. 1 is a perspective view illustrating that a display device including a microlens array is applied in a wearable electronic device, and FIG. 2 is a side view schematically illustrating that a virtual image is created in the wearable electronic device shown in FIG. 1.

Referring to FIG. 1 and FIG. 2, the wearable electronic device 100, in which a display device DP including a microlens array MLA is applied, may include a frame 110.

The frame 110 may be combined with or connected to a fixing part 120, and a user may wear the frame 110 on his or her head using the fixing part 120. The frame 110 has a structure to which the display device DP is attachable or from which the display device DP is detachable.

The display device DP may include a display panel PNL and a microlens array MLA.

The display panel PNL may emit light for providing an image IMG. The light may be for creating a two-dimensional image or a three-dimensional image.

The microlens array MLA may create a virtual image VIMG from the image IMG provided from the display panel PNL and project the virtual image VIMG onto the eyes of the user who wears the wearable electronic device 100. For example, the microlens array MLA may show the virtual image VIMG, projected onto the eyes of user who wears the wearable electronic device 100, as if it is behind the display panel PNL, and may also function to enlarge the same.

The microlens array MLA may include multiple microlenses 210 having the same diameter. Although FIG. 2 illustrates the microlens array MLA as including only three microlenses 210, the microlens array MLA may include more microlenses 210 in order to extend the field of view 200.

The magnification of the microlens array MLA may be determined depending on the magnifications of the individual microlenses 210. The microlens array MLA may be positioned so as to be spaced a preset (or predetermined) distance apart from the display panel PNL such that the microlens array MLA is perpendicular to the light emitted from the display panel PNL. Also, the microlens array MLA may be spaced a preset (or predetermined) distance apart from the display panel PNL in order to collimate the light emitted from the display panel PNL such that the light is delivered to the eyes of the user.

Meanwhile, the display panel PNL may be combined with the microlens array MLA through a bonding process in the display device DP. For example, the display panel PNL and the microlens array MLA, which are produced through separate processes, may be aligned and bonded using a transparent optical resin.

When the microlens array MLA is bonded to the display panel PNL in the bonding process, the bonding precision may be decreased due to alignment tolerance, which may cause misalignment of the microlens array MLA.

For example, in the case of the separately produced microlens array MLA, a fabrication error may occur when the microlens array MLA is produced, and such a fabrication error may cause misalignment when the microlens array MLA is bonded to the display panel PNL.

Here, misalignment of the microlens array MLA may narrow the field of view 200 of the wearable electronic device 100 in which the display device DP is applied. Also, misalignment of the microlens array MLA increases the shift tolerance of the microlenses 210 included in the microlens array MLA, thereby degrading the display quality of the virtual image VIMG projected onto the eyes of the user.

Furthermore, the microlens array MLA including the microlenses 210 may be formed through a photolithography process, a replica molding process, an imprinting process, and the like, which are very complicated processes. For example, because it may not be easy to control the height and curvature of the microlenses 210 produced through these processes, it may be difficult to apply the microlens array MLA including the microlenses 210 in various types of display devices.

Also, the microlens array MLA including the microlenses 210 produced through the above-described processes may have a thickness that is greater than a certain value. That is, because the microlens array MLA has a thickness that is greater than the certain value, it may not be easy to realize slimness of the display device DP.

Accordingly, it may be helpful to resolve misalignment of the above-described microlens array MLA in the display device DP, which may be installed in the wearable electronic device 100.

Figure 3:
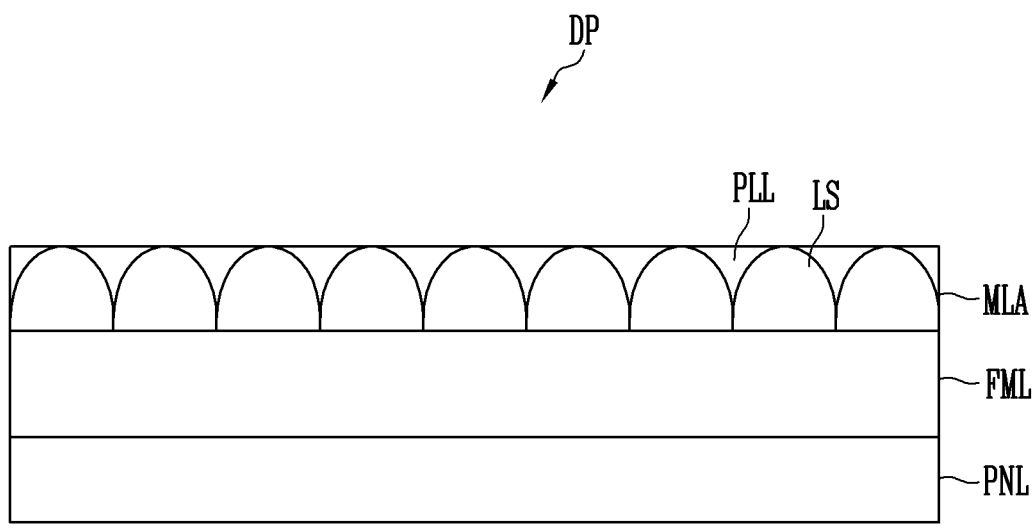
FIG. 3 is a cross-sectional view schematically illustrating a display device according to some example embodiments.
Figure 4:
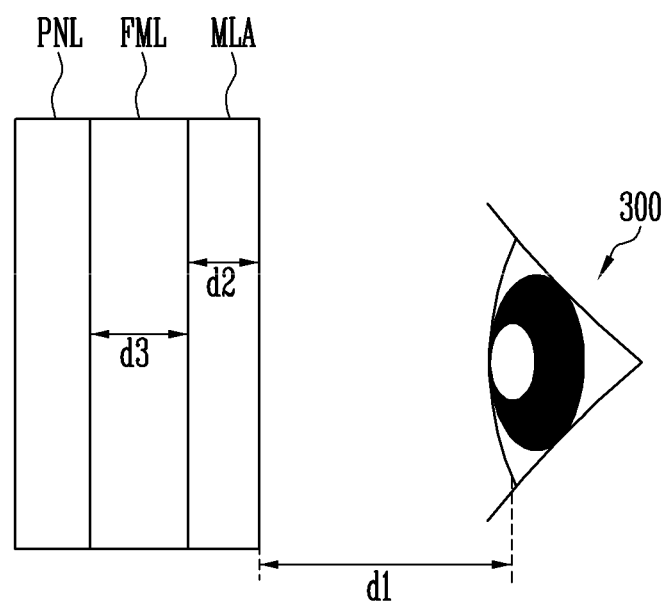
FIG. 4 is a side view schematically illustrating that the display device shown in FIG. 3 is applied in a wearable electronic device.

FIG. 3 is a cross-sectional view schematically illustrating a display device according to some example embodiments of the present disclosure, and FIG. 4 is a side view schematically illustrating that the display device shown in FIG. 3 is applied in a wearable electronic device.

Referring to FIG. 3 and FIG. 4, the display device DP according to an embodiment of the present disclosure may include a display panel PNL and a microlens array MLA.

The display panel PNL may emit light for displaying an image. To this end, display elements (e.g., pixels), configured to emit light and provide an image corresponding to the light, may be included in the display panel PNL. For example, the display elements may include a pixel circuit part, which includes at least one light-emitting element for emitting light and at least one transistor for driving the light-emitting element, and the like.

The display panel PNL is not limited to any specific type of display panel. For example, a display panel capable of emitting light by itself, such as an Organic Light-Emitting Display (OLED) panel, or the like, may be used as the display panel PNL. Also, any one of non-emissive display panels that do not emit light by themselves, such as a Liquid Crystal Display (LCD) panel, an Electro-Phoretic Display (EPD) panel, and an Electro-Wetting Display (EWD) panel, may be used as the display panel PNL.

Hereinafter, an embodiment in which an OLED panel is used as the display panel PNL will be described.

The microlens array MLA may function to collect light for an image, which is provided from the display panel PNL, into the space above the microlens array MLA. Here, the eyes 300 of a user may be located in the space above the microlens array MLA.

Also, the microlens array MLA may create a virtual image from the image provided from the display panel PNL and project the same onto the eyes 300 of the user who wears the wearable electronic device (100 in FIG. 1) in which the display device DP is applied.

The microlens array MLA may be located on one side of the display panel PNL, on which the image is displayed, and may be spaced a preset (or predetermined) distance apart from the display panel PNL.

When light emitted from the display panel PNL passes through the microlens array MLA, the microlens array MLA may collect and collimate the light so as to be delivered to the eyes 300 of the user. Accordingly, the light collimated by the microlens array MLA may enter the eyes 300 of the user and converge at a single point on the retina at the back of the eye 300 of the user.

The microlens array MLA may be spaced a certain distance apart from the eyes 300 of the user in order to secure the field of view of the user and to provide an image of high display quality. In an embodiment of the present disclosure, the distance d1 between the microlens array MLA and the eyes 300 of the user may be equal to or less than about 50 mm, but the present disclosure is not limited thereto.

In some example embodiments of the present disclosure, the microlens array MLA may include multiple lens shapes LS and a planar part PLL for covering the lens shapes LS. The microlens array MLA may be configured such that a refractive index varies from region to region due to the lens shapes LS in the microlens array MLA.

In some example embodiments of the present disclosure, the refractive index of each of the lens shapes LS and the refractive index of the planar part PLL may differ from each other. For example, the refractive index of each of the lens shapes LS may range from 1.4 to 1.6, but the refractive index of the planar part PLL for covering the respective lens shapes LS may be less than 1.5. However, the present disclosure is not limited to this example, and the refractive index of each of the lens shapes LS and the refractive index of the planar part PLL may vary depending on the conditions for designing the microlens array MLA, the conditions and circumstances for applying the microlens array MLA, and the like.

The microlens array MLA may have a thickness d2 that is equal to or less than 100 µm, but the present disclosure is not limited thereto. A more detailed description of the microlens array MLA will be made later with reference to FIG. 8.

Meanwhile, the display device DP according to some example embodiments of the present disclosure may further include an optical path adjustment layer FML.

The optical path adjustment layer FML may function to collect light emitted from the display panel PNL and to guide the same to the microlens array MLA. For example, the optical path adjustment layer FML may be used as a focus matching layer for focusing the microlens array MLA on the eyes 300 of the user. To this end, the optical path adjustment layer FML is required to make the display panel PNL and the microlens array MLA maintain a fixed distance therebetween. The optical path adjustment layer FML may have a thickness that is equal to or greater than a certain value. For example, the optical path adjustment layer FML may have a thickness d3 that is equal to or less than 400 µm, but the present disclosure is not limited thereto.

Figure 5:
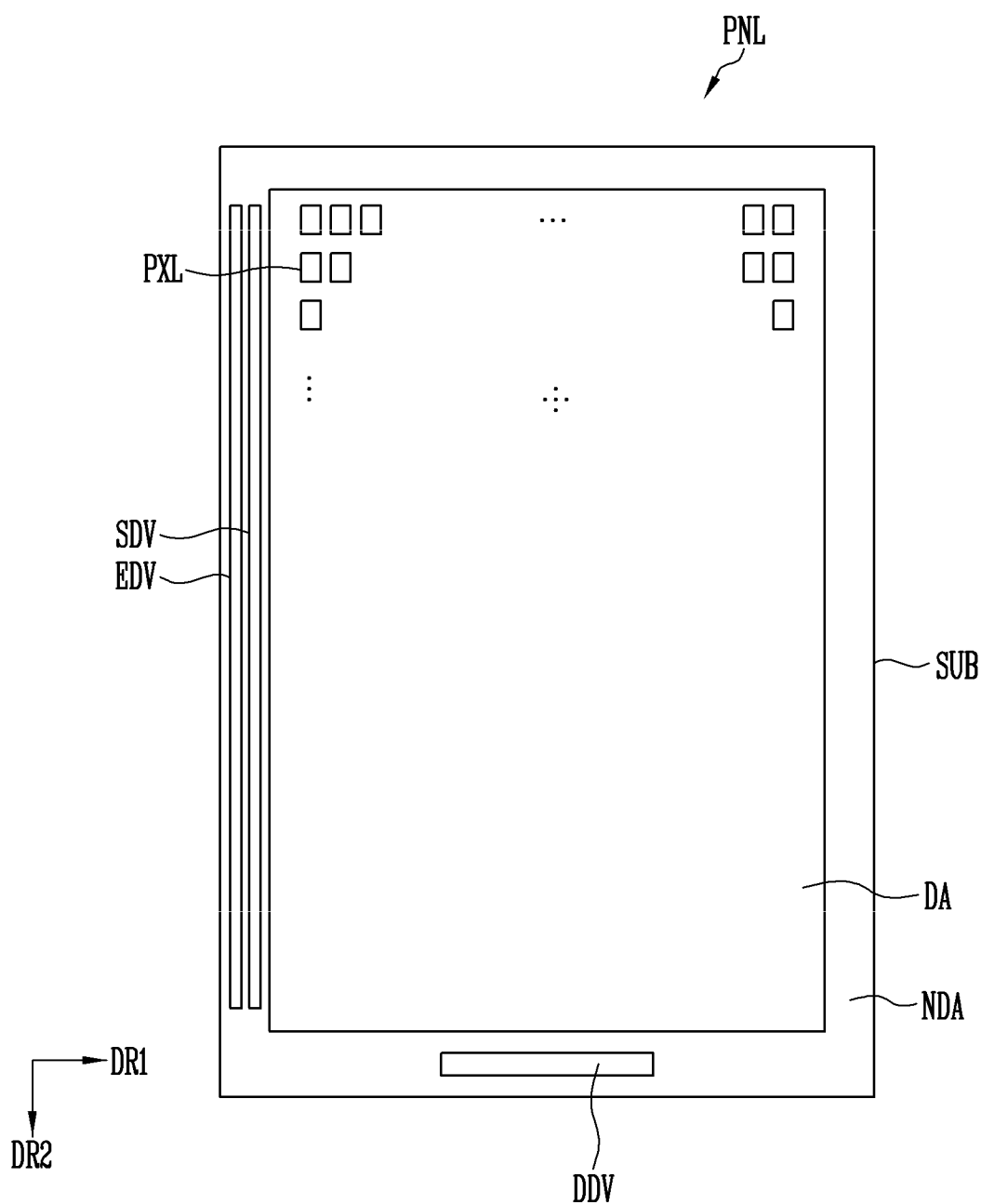
FIG. 5 is a top plan view schematically illustrating the display panel shown in FIG. 3.

In some example embodiments of the present disclosure, the optical path adjustment layer FML may be made of a transparent material such that light emitted from the display panel PNL travels to the microlens array MLA without loss. For example, the optical path adjustment layer FML may include any one of a silicon-based material, an optically transparent adhesive material, and a transparent optical resin, but the present disclosure is not limited thereto. FIG. 5 is a top plan view schematically illustrating the display panel shown in FIG. 3.

Referring to FIG. 3 and FIG. 5, the display panel PNL may include a substrate SUB, pixels PXL, a driving part, a power supply part, a wiring part, and the like.

The substrate SUB may include a display area DA and a non-display area NDA. The display area DA may be an area in which pixels PXL for displaying an image are provided. The respective pixels PXL will be described in more detail later.

The non-display area NDA is an area in which no image is displayed. The driving part for driving the pixels PXL, the power supply part for supplying power to the pixels PXL, and some of the lines for coupling the pixels PXL to the driving part may be provided in the non-display area NDA. A portion of the non-display area NDA may correspond to the bezel of the complete display device DP, and the width of the bezel may be determined depending on the width of the non-display area NDA.

The pixels PXL may be provided in the display area DA. Each of the pixels PXL is the smallest unit for displaying an image, and multiple pixels PXL may be provided in the display area DA. Each of the pixels PXL may include a display element for emitting light. For example, the display element may be any one of a liquid crystal display (LCD) device, an electrophoretic display (EPD) device, an electrowetting display (EWD) device, and an organic light-emitting display (OLED) device. For convenience of description, an example in which an OLED device is used as a display element will be described.

Each of the pixels PXL may emit light having any one color among red, green, and blue, but the color is not limited thereto. For example, each of the pixels PXL may emit light, the color of which is cyan, magenta, yellow, white, or the like. The pixels PXL may be arranged along the rows extending in a first direction DR1 and along the columns extending in a second direction DR2, which is perpendicular to the first direction DR1, so as to be in the form of a matrix. The pixels PXL may be arranged in various forms without limitation to any specific arrangement.

The driving part supplies signals to the respective pixels PXL through the wiring part, thereby controlling the operations of the respective pixels PXL.

The driving part may include a scan driving part (or scan driver) SDV for transmitting scan signals to the respective pixels PXL along scan lines, an emission driving part (or emission driver) EDV for supplying light emission control signals to the respective pixels PXL along emission control lines, a data driving part (or data driver) DDV for supplying data signals to the respective pixels PXL along data lines, and a timing control part (or timing controller). The timing control part may control the scan driving part SDV, the emission driving part EDV, and the data driving part DDV.

The timing control part may be coupled to the scan driving part SDV, the emission driving part EDV, and the data driving part DDV through lines using any of various methods. The position of the timing control part is not limited to any specific position. For example, the timing control part may be embedded in the printed circuit board and be coupled to the scan driving part SDV, the emission driving part EDV, and the data driving part DDV through the flexible printed circuit board. Here, the printed circuit board may be at any of various positions, such as on one side of the substrate SUB, on the back of the substrate SUB, or the like.

The power supply part (or power supply) may include at least one power supply line. For example, the power supply part may include a first power supply line and a second power supply line. The power supply part may supply power to the respective pixels PXL that are located in the display area DA. In an embodiment of the present disclosure, a voltage applied to the first power supply line may be higher than a voltage applied to the second power supply line.

Figure 6:
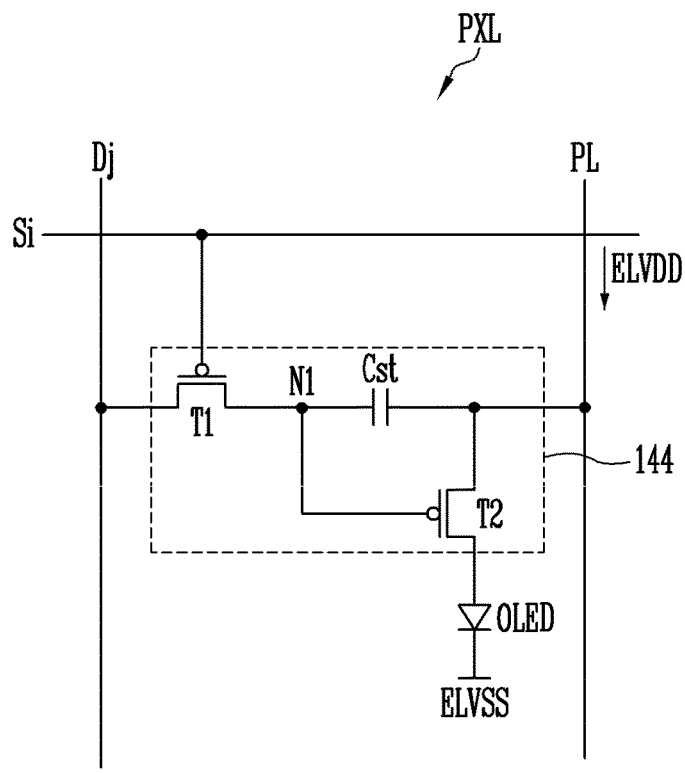
FIG. 6 is an equivalent circuit diagram illustrating one of the pixels shown in FIG. 5.

FIG. 6 is an equivalent circuit diagram illustrating one of the pixels shown in FIG. 5. For convenience of description, FIG. 6 illustrates a single pixel and lines coupled thereto.

Referring to FIG. 5 and FIG. 6, each of the pixels PXL may include an OLED, which is coupled between a first power source ELVDD and a second power source ELVSS, and a pixel driving circuit 144 for driving the OLED by being coupled thereto.

The first electrode (e.g., the anode electrode) of the OLED is coupled to the first power source ELVDD via the pixel driving circuit 144, and the second electrode (e.g., the cathode electrode) of the OLED is coupled to the second power source ELVSS. The OLED may be a front-emitting OLED or a back-emitting OLED. The OLED may be an organic light-emitting diode.

The first power source ELVDD and the second power source ELVSS may have different electric potentials. For example, the electric potential of the second power source ELVSS may be lower than that of the first power source ELVDD, and the difference therebetween may be equal to or higher than the threshold voltage of the OLED.

The OLED may emit light with the brightness corresponding to the driving current controlled by the pixel driving circuit 144.

According to some example embodiments of the present disclosure, the pixel driving circuit 144 may include a first transistor T1, a second transistor T2, and a storage capacitor Cst. However, the structure of the pixel driving circuit 144 is not limited to the embodiment shown in FIG. 6.

The first electrode of the first transistor (switching transistor) T1 is coupled to a data line Dj, and the second electrode thereof is coupled to a first node N1. Here, the first electrode of the first transistor T1 differs from the second electrode thereof. For example, when the first electrode is a source electrode, the second electrode may be a drain electrode. The gate electrode of the first transistor T1 is coupled to a scan line Si.

The first transistor T1 is turned on when a scan signal with a voltage level (e.g., a low-level voltage) that is sufficient to turn on the first transistor T1 is supplied from the scan line Si, thereby electrically coupling the data line Dj to the first node N1. Here, the data signal of a corresponding frame is supplied to the data line Dj, whereby the data signal is supplied to the first node N1. The data signal delivered to the first node N1 is stored in the storage capacitor Cst.

The first electrode of the second transistor (driving transistor) T2 is coupled to the first power source ELVDD, and the second electrode thereof is electrically coupled to the first electrode of the OLED. The gate electrode of the second transistor T2 is coupled to the first node N1. The second transistor T2 controls the amount of driving current supplied to the OLED in response to the voltage of the first node N1.

One electrode of the storage capacitor Cst is coupled to the first power source ELVDD, and the other electrode thereof is coupled to the first node N1. The storage capacitor Cst stores voltage corresponding to the data signal supplied to the first node N1 and maintains the voltage until the data signal of the next frame is supplied.

For convenience of description, FIG. 6 illustrates the pixel driving circuit 144 having a relatively simple structure, which includes the first transistor T1 for delivering a data signal to each of the pixels PXL, the storage capacitor Cst for storing the data signal, and the second transistor T2 for supplying driving current, corresponding to the data signal, to the OLED.

However, the present disclosure is not limited to the above-described structure, and the structure of the pixel driving circuit 144 may be variously changed and implemented. For example, the pixel driving circuit 144 may further include at least one transistor, such as a transistor for compensating for the threshold voltage of the second transistor T2, a transistor for initializing the first node N1, and/or a transistor for controlling the time during which the OLED emits light, or other circuit elements, such as a boosting capacitor for boosting the voltage of the first node N1, and the like.

Also, although all of the transistors included in the pixel driving circuit 144, that is, the first transistor T1 and the second transistor T2, have been illustrated as P-type transistors in FIG. 6, the present disclosure is not limited thereto. That is, at least one of the first transistor T1 and the second transistor T2 included in the pixel driving circuit 144 may be replaced with an N-type transistor.

Figure 7:
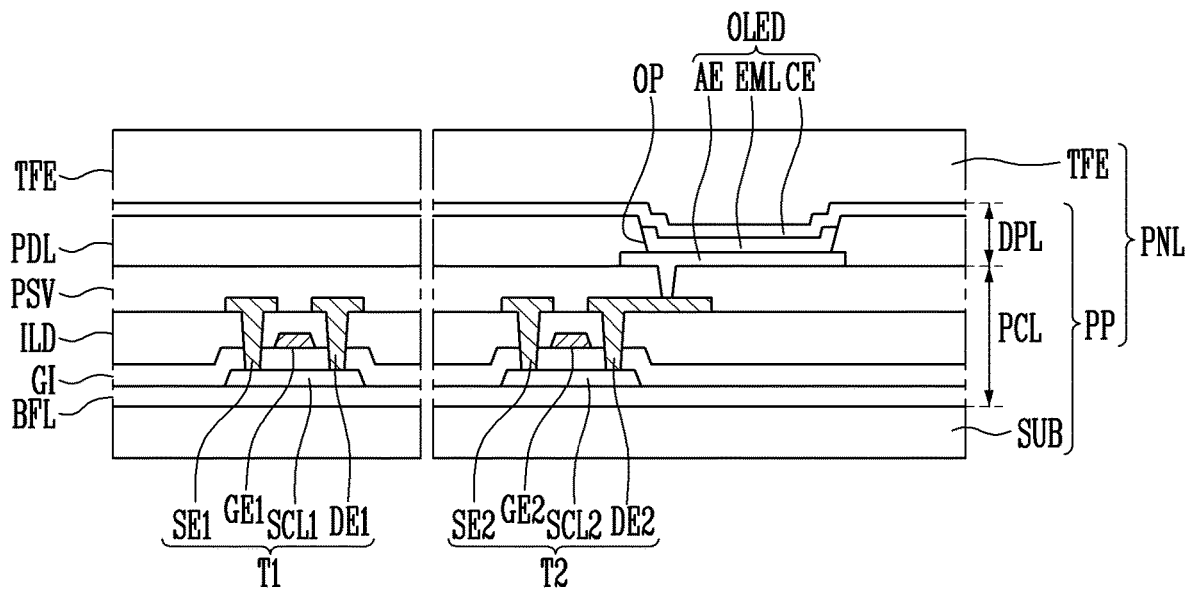
FIG. 7 is a cross-sectional view illustrating a portion of the display panel shown in FIG. 5.

FIG. 7 is a cross-sectional view illustrating a portion of the display panel shown in FIG. 5.

Referring to FIG. 5 and FIG. 7, the display panel PNL according to some example embodiments of the present disclosure may include a display part (or display) PP and a thin encapsulation film TFE.

The display part PP may include a substrate SUB, a pixel circuit part PCL, and a display element layer DPL.

The substrate SUB may be made of an insulation material, such as glass, resin, or the like. Also, the substrate SUB may be made of a material having flexibility so as to be bendable or foldable, and may have a single layer structure or a multi-layer structure.

For example, such a material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, the material of the substrate SUB may vary. For example, the substrate SUB may be made of fiber glass reinforced plastic (FRP), and the like.

The pixel circuit part PCL may include a buffer layer BFL, located on the substrate SUB, and a first transistor T1 and a second transistor T2, which are located on the buffer layer BFL.

The buffer layer BFL may prevent impurities from diffusing into the first transistor T1 and the second transistor T2. The buffer layer BFL may be provided as a single layer, but may be provided as multiple layers including at least two layers. When the buffer layer BFL is provided as multiple layers, the respective layers may be made of the same material or different materials. The buffer layer BFL may be omitted depending on the material of the substrate SUB or process conditions.

The first transistor T1 may be a switching transistor for switching the second transistor T2 on or off. The second transistor T2 may be a driving transistor for driving the OLED of the display element layer DPL by being electrically coupled to the OLED.

The first transistor T1 may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first semiconductor layer SCL1 and the second semiconductor layer SCL2 may be located on the buffer layer BFL. The first semiconductor layer SCL1 may include a source region and a drain region that are in contact with the first source electrode SE1 and the first drain electrode DE1, respectively, and the second semiconductor layer SCL2 may include a source region and a drain region that are in contact with the second source electrode SE2 and the second drain electrode DE2, respectively.

The region between the source region and the drain region may be a channel region. Each of the first semiconductor layer SCL1 and the second semiconductor layer SCL2 may be a semiconductor pattern made of polysilicon, amorphous silicon, oxide semiconductor, and the like. The channel region is a semiconductor pattern that is not doped with impurities, and may be an intrinsic semiconductor. Each of the source region and the drain region may be a semiconductor pattern doped with impurities. Here, impurities, such as n-type impurities, p-type impurities, and metals, may be used.

The first gate electrode GE1 may be provided above the first semiconductor layer SCL1, and a gate insulation layer GI may be present therebetween. The second gate electrode GE2 may be provided above the second semiconductor layer SCL2, and the gate insulation layer GI may be present therebetween. Here, the gate insulation layer GI may be an inorganic insulation film including an inorganic material. For example, the gate insulation layer GI may be made of silicon nitride, silicon oxide, silicon oxynitride, and the like.

The first source electrode SE1 and the first drain electrode DE1 may be in contact with the source region and the drain region of the first semiconductor layer SCL1, respectively, through contact holes that penetrate through an interlayer insulation layer ILD and the gate insulation layer GI. The second source electrode SE2 and the second drain electrode DE2 may be in contact with the source region and the drain region of the second semiconductor layer SCL2, respectively, through contact holes that penetrate through the interlayer insulation layer ILD and the gate insulation layer GI.

The interlayer insulation layer ILD may be an inorganic insulation film made of an inorganic material or an organic insulation film made of an organic material.

The pixel circuit part PCL may further include a protective layer PSV for covering the first transistor T1 and the second transistor T2 by being on the first transistor T1 and the second transistor T2. The protective layer PSV may include at least one of an inorganic insulation film made of an inorganic material and an organic insulation film made of an organic material. For example, the protective layer PSV may include an inorganic insulation film and an organic insulation film on the inorganic insulation film.

The display element layer DPL may include an OLED provided on the protective layer PSV. The OLED may include a first electrode AE, a second electrode CE, and an emission layer EML provided therebetween. Here, any one of the first electrode AE and the second electrode CE may be an anode electrode, and the other one may be a cathode electrode. For example, the first electrode AE may be an anode electrode, and the second electrode CE may be a cathode electrode. When the OLED is a front-emitting OLED, the first electrode AE may be a reflective electrode, and the second electrode CE may be a transmissive electrode. In an embodiment of the present disclosure, an example in which the OLED is a front-emitting OLED and the first electrode AE is an anode electrode will be described.

The first electrode AE may be electrically coupled to the second drain electrode DE2 of the second transistor T2 through a contact hole that penetrates through the protective layer PSV. The first electrode AE may include a reflective film that is capable of reflecting light and a transparent conductive film that is located above or below the reflective film. At least one of the transparent conductive film and the reflective film may be electrically coupled to the second drain electrode DE2.

The display element layer DPL may further include a pixel definition layer PDL including a portion of the first electrode AE, for example, an opening OP that exposes the upper surface of the first electrode AE.

The pixel definition layer PDL may include an organic insulation material. For example, the pixel definition layer PDL may include at least one of polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane-based resin.

The emission layer EML may be provided on the exposed surface of the first electrode AE.

The emission layer EML may include a low-molecular material or a high-molecular material. In an embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum (Alq3), and the like. The high-molecular material may include PEDOT-, poly-phenylenevinylene (PPV)—, polyfluorene-based materials, and the like.

The emission layer EML may be provided as a single layer, but may be provided as multiple layers including various functional layers. When the emission layer EML is provided as multiple layers, the emission layer EML may have a structure in which a hole injection layer, a hole transport layer, an emission layer, an electron transport layer, an electron injection layer, and the like are stacked in a single or complex structure.

The emission layer is not limited to the above-described structure, and may have different structures. Also, at least a portion of the emission layer EML may be integrated so as to be located over multiple first electrodes AE, or may be individually provided so as to correspond to each of the multiple first electrodes AE. The color of light generated in the emission layer EML may be one of red, green, blue, and white, but the color is not limited thereto in the present embodiment. For example, the color of light generated in the light generation layer of the emission layer EML may be one of magenta, cyan, and yellow.

The second electrode CE may be provided on the emission layer EML. The second electrode CE may be a semi-transmissive reflective film. For example, the second electrode CE may be a thin metal layer, the thickness of which is suitable to transmit the light emitted from the emission layer EML. The second electrode CE may transmit some of the light emitted from the emission layer EML and reflect the remaining light.

The thin encapsulation film TFE may be provided on the OLED.

The thin encapsulation film TFE may be a single layer, but may be multiple layers. The thin encapsulation film TFE may include multiple insulation films that cover the OLED. For example, the thin encapsulation film TFE may include multiple inorganic films and multiple organic films. For example, the thin encapsulation film TFE may have a structure in which the inorganic film and the organic film are alternately stacked. Also, depending on the circumstances, the thin encapsulation film TFE may be an encapsulation substrate, located on the OLED and bonded to the substrate SUB using a sealant.

Figure 8:
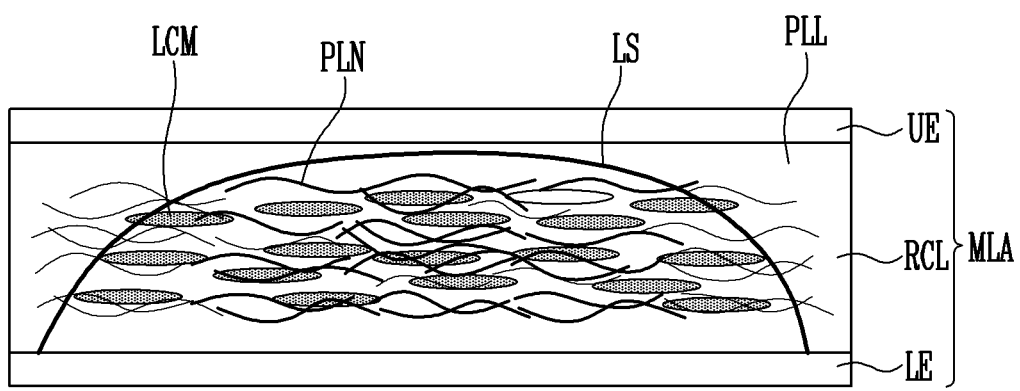
FIG. 8 is a cross-sectional view schematically illustrating a portion of the microlens array shown in FIG. 3.
Figure 9:
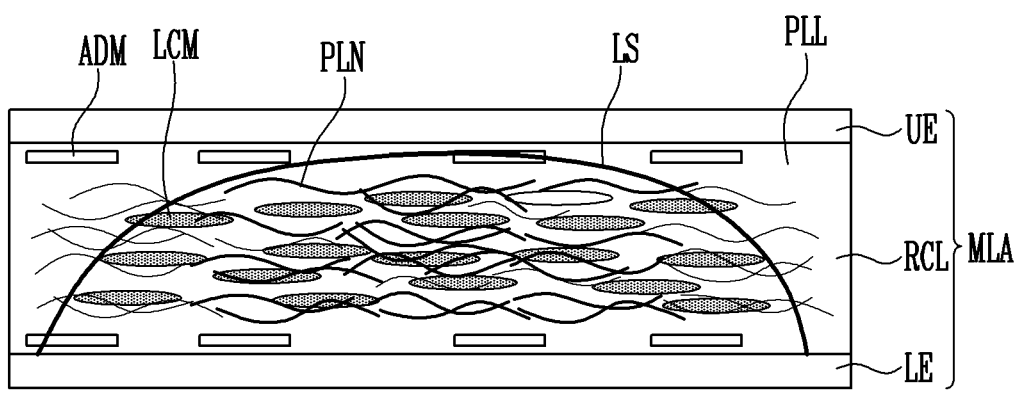
FIG. 9 is a cross-sectional view illustrating the microlens array shown in FIG. 8 according to some example embodiments.

FIG. 8 is a cross-sectional view schematically illustrating a portion of the microlens array shown in FIG. 3, and FIG. 9 is a cross-sectional view illustrating the microlens array shown in FIG. 8 according to some example embodiments.

Referring to FIG. 3, FIG. 8 and FIG. 9, the microlens array MLA according to some example embodiments of the present disclosure may include a lower electrode LE and an upper electrode UE, which face each other, and a refractive index conversion layer RCL provided between the lower electrode LE and the upper electrode UE.

The lower electrode LE may be located directly on the display panel PNL, and may be made of a transparent conductive material in order to minimize or reduce a loss of light emitted from the display panel PNL and to prevent or reduce scattering and absorption. The transparent conductive material may include, for example, ITO, IZO, ITZO, and the like. These materials may be used solely or in combination. The material of the lower electrode LE is not limited to the above-described materials. The lower electrode LE may have a single layer structure or a multi-layer structure.

The upper electrode UE is located above the lower electrode LE, and may include the same material as the lower electrode LE. That is, the upper electrode UE may also be made of a transparent conductive material.

The refractive index conversion layer RCL may include a liquid crystal cell, including multiple liquid crystal molecules LCM having dielectric anisotropy and refractive index anisotropy, and a polymer network PLN. Each of the liquid crystal molecules LCM has a refractive index that ranges from 1.4 and 1.6 in the direction of the major axis thereof, and the difference between the refractive index in the direction of the major axis and that in the direction of the minor axis may range from about 0.15 to 0.5, but the present disclosure is not limited thereto.

The liquid crystal cell may include twisted or non-twisted nematic liquid crystal cells, twisted or non-twisted smectic liquid crystal cells, and the like. In an embodiment of the present disclosure, the liquid crystal cell may be a twisted nematic liquid crystal cell, but the liquid crystal cell is not limited thereto.

The polymer network PLN may be formed using a reactive mesogen (RM), a photopolymerizable monomer, a photoinitiator, a UV-curable monomer, and the like. For example, the polymer network PLN may be a crosslinked polymer that is formed by radiating ultraviolet light to UV-curable monomers. In some example embodiments of the present disclosure, the content of the polymer network PLN may be equal to or greater than about 0.01% in the refractive index conversion layer RCL.

According to some example embodiments, the refractive index conversion layer RCL may further include an additive material ADM for desirable arrangement of the liquid crystal molecules, as shown in FIG. 9. The additive material ADM may include, for example, an alignment material. When the additive material ADM is included in the refractive index conversion layer RCL, the liquid crystal molecules LCM in the refractive index conversion layer RCL may be stably aligned in the direction defined by the additive material ADM.

The refractive index conversion layer RCL may be configured such that a refractive index varies from region to region depending on the different density of the polymer network PLN and on the degree of movement of the liquid crystal molecules LCM. In the refractive index conversion layer RCL, the flow or movement of the liquid crystal molecules LCM may be partially or entirely limited by the polymer network PLN. For example, in the refractive conversion layer RCL, the movement of the liquid crystal molecules LCM in the region in which the density of the polymer network PLN is high may be more limited than the region in which the density of the polymer network PLN is low.

Accordingly, the refractive index of the liquid crystal molecules LCM in the region in which the density of the polymer network PLN is high may differ from that in the region in which the polymer network PLN is low. For example, the refractive index of the liquid crystal molecules LCM may be high in the region in which the density of the polymer network PLN is high, but the refractive index of the liquid crystal molecules LCM may be low in the region in which the density of the polymer network PLN is low.

The difference between the refractive indices of the liquid crystal molecules LCM causes a refractive index to vary from region to region in the refractive index conversion layer RCL. Also, the different density of the polymer network PLN in different regions may form a lens shape LS (hereinafter, referred to as 'lens') in the refractive index conversion layer RCL.

Also, the refractive index conversion layer RCL may include a planar layer PLL for covering the lens LS. In some example embodiments of the present disclosure, the planar layer PLL may indicate a region in which the refractive index is constant because liquid crystal molecules LCM are not distributed and the density of the polymer network PLN is low.

The method for fabricating the refractive index conversion layer RCL will be described in more detail with reference to FIG. 10A and FIG. 10B.

Figure 10A:
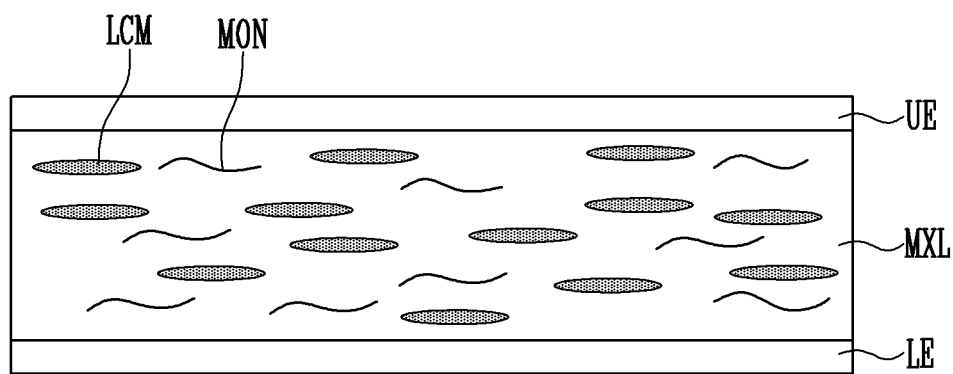
FIG. 10A is a cross-sectional view schematically illustrating a microlens array according to some example embodiments before ultraviolet light is radiated.
Figure 10B:
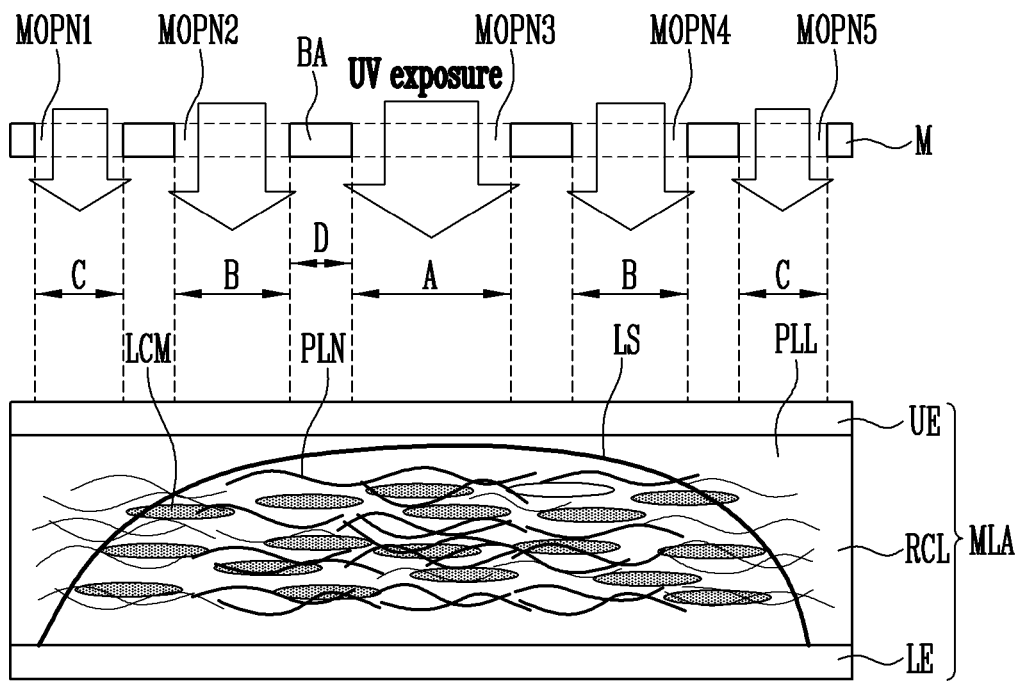
FIG. 10B is a cross-sectional view schematically illustrating a microlens array according to some example embodiments after ultraviolet light is radiated.

FIG. 10A is a cross-sectional view schematically illustrating a microlens array according to an embodiment of the present disclosure before ultraviolet light is radiated, and FIG. 10B is a cross-sectional view schematically illustrating a microlens array according to an embodiment of the present disclosure after ultraviolet light is radiated.

Referring to FIG. 10A and FIG. 10B, a mixture layer MXL in which liquid crystal molecules LCM and UV-curable monomers MON are mixed may be located between a lower electrode LE and an upper electrode UE.

An electric field formed between the lower electrode LE and the upper electrode UE arranges the liquid crystal molecules LCM in a specific direction in the mixture layer MXL. For example, when an alignment material is included in the mixture layer MXL, the liquid crystal molecules LCM may be stably aligned in the direction determined by the alignment material.

The liquid crystal molecules LCM arranged in the mixture layer MXL may have a constant refractive index regardless of the region in the mixture layer MXL.

Then, a mask M including openings MOPN1 to MOPN5 is arranged on the upper electrode UE, and a light (e.g., a predetermined type of light), for example, ultraviolet light, is radiated to the mixture layer MXL through the mask M.

When ultraviolet light is radiated to the mixture layer MXL, the UV-curable monomers MON in the mixture layer MXL react to the ultraviolet light, whereby a crosslinked polymer network PLN may be formed. That is, after ultraviolet light is radiated to the mixture layer MXL, the mixture layer MXL may become a refractive index conversion layer RCL that includes the polymer network PLN and the liquid crystal molecules LCM, the movement of which is limited by the polymer network PLN.

The mask M may include first to fifth openings MOPN1 to MOPN5 and blocking parts BA located between the first to fifth openings MOPN1 to MOPN5. In some example embodiments of the present disclosure, the first to fifth openings MOPN1 to MOPN5 may have different sizes.

For example, the third opening MOPN3 located at the center of the mask M may have the largest size, each of the second and fourth openings MOPN2 and MOPN4 located on the opposite sides of the third opening MOPN3 may have a smaller size than the third opening MOPN3, and each of the first and fifth openings MOPN1 and MOPN5 located at the opposite ends may have the smallest size.

Also, when the first to fifth openings MOPN1 to MOPN5 have different sizes, the blocking parts BA located therebetween may have different sizes depending on the sizes of the corresponding openings.

For convenience of description, the mask M has been illustrated as including the five openings MOPN1 to MOPN5, but the present disclosure is not limited thereto. That is, the mask M may include more openings.

Because the first to fifth openings MOPN1 to MOPN5 have different sizes, the amount of ultraviolet light that is radiated to the mixture layer MXL after passing through each of the first to fifth openings MOPN1 to MOPN5 may vary depending on the size of the corresponding opening. For example, the greatest amount of ultraviolet light may be radiated to a region A in the mixture layer MXL that corresponds to the third opening MOPN3 having the largest size, and the lowest amount of ultraviolet light may be radiated to regions C in the mixture layer MXL that respectively correspond to the first and fifth openings MOPN1 and MOPN5, each of which has the smallest size. Also, no ultraviolet light may be radiated to a region D in the mixture layer MXL that does not correspond to any of the first to fifth openings MOPN1 to MOPN5.

According to some example embodiments, the region A in the mixture layer MXL corresponding to the third opening MOPN3 is referred to as a 'first region', the regions B in the mixture layer MXL respectively corresponding to the second and fourth openings MOPN2 and MOPN4 are referred to as a 'second region', the regions C in the mixture layer MXL respectively corresponding to the first and fifth openings MOPN1 and MOPN5 are referred to as a 'third region', and the region D in the mixture layer MXL corresponding to the blocking part BA is referred to as a 'fourth region' for convenience of description.

In some example embodiments of the present disclosure, the density of the polymer network PLN in the first region A, to which a large amount of ultraviolet light is radiated, may be higher than that in the second to fourth regions B, C and D. That is, the density of the polymer network PLN provided in the first region A may be higher than the density of the polymer network PLN provided in the second to fourth regions B, C and D.

Also, the density of the polymer network PLN in the second region B may be higher than that in the third and fourth regions C and D. That is, the density of the polymer network PLN provided in the second region B may be higher than the density of the polymer network PLN provided in the third and fourth regions C and D.

Also, the density of the polymer network PLN in the third region C may be higher than that in the fourth region D. That is, the density of the polymer network PLN provided in the third region C may be higher than the density of the polymer network PLN provided in the fourth region D.

The different density of the polymer network in the first to fourth regions A, B, C and D may cause the refractive indices of the liquid crystal molecules LCM in the first to fourth regions A, B, C and D to differ from each other because the degree by which the movement of the liquid crystal molecules LCM provided in the first to fourth regions A, B, C and D is limited varies depending on the density of the polymer network therein.

For example, the refractive index of the liquid crystal molecules LCM in the first region A may be higher than the refractive index of the liquid crystal molecules LCM in each of the second to fourth regions B, C and D, the refractive index of the liquid crystal molecules LCM in the second region B may be higher than the refractive index of the liquid crystal molecules LCM in each of the third and fourth regions C and D, and the refractive index of the liquid crystal molecules LCM in the third region C may be higher than the refractive index of the liquid crystal molecules LCM in the fourth region D.

For example, more polymer networks PLN are provided in the first region A, compared to the second to fourth regions B, C and D, and less polymer networks PLN may be provided in the second to fourth regions B, C and D, compared to the first region A. The different density of the polymer network PLN in the first to fourth regions A, B, C and D and the difference between the refractive indices of the liquid crystal molecules LCM interacting with the polymer network PLN in the first to fourth regions A, B, C and D may form a lens shape LS in the refractive index conversion layer RCL. Accordingly, the refractive index conversion layer RCL may function as the lens of the microlens array MLA.

Because the refractive index conversion layer RCL configured as described above functions as a lens, the microlens array MLA may collimate light emitted from the display panel PNL in a specific direction although it does not include a special microlens.

Figure 11A:
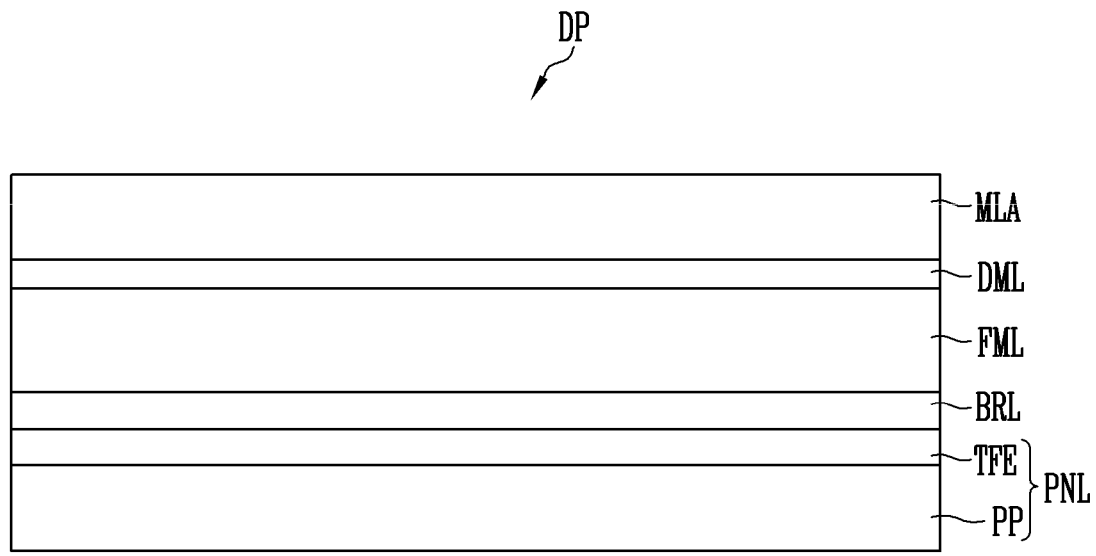
FIG. 11A and FIG. 11B are cross-sectional views schematically illustrating display devices each including the microlens array shown in FIG. 8.
Figure 11B:
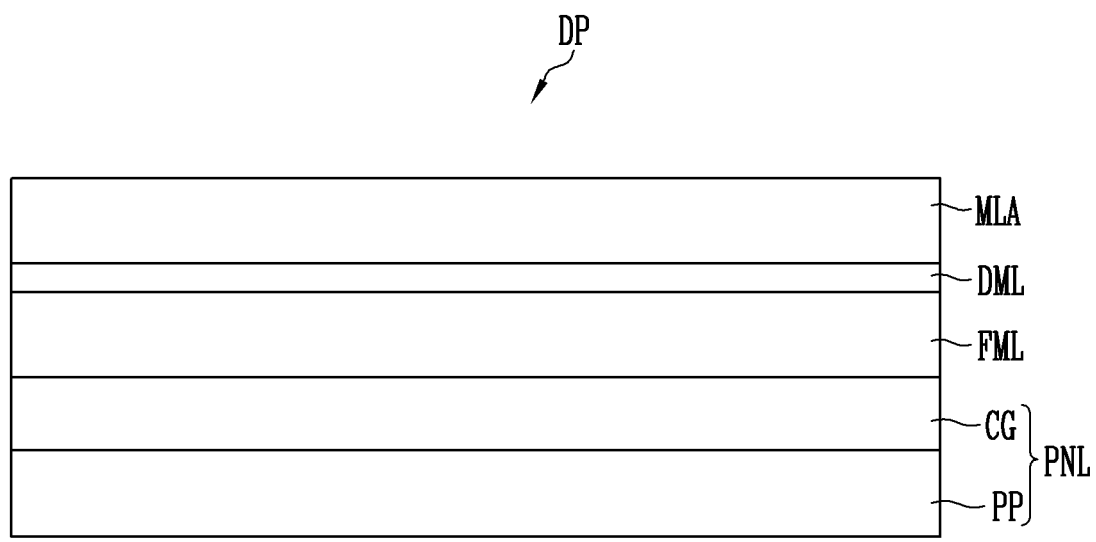

FIG. 11A and FIG. 11B are cross-sectional views schematically illustrating display devices each including the microlens array shown in FIG. 8.

With regard to the display devices shown in FIG. 11A and FIG. 11B, the difference between the present embodiment and the above-described embodiment will be mainly described in order to prevent a repeated description. A part not specially illustrated in the present embodiment is in accordance with the above-described embodiment. Also, the same reference numerals denote the same components, and similar reference numerals denote similar components.

First, referring to FIG. 8 and FIG. 11A, the display device DP according to some example embodiments of the present disclosure may include a display panel PNL, a barrier layer BRL, an optical path adjustment layer FML, and a microlens array MLA.

The display panel PNL may include a display layer PP and a thin encapsulation film TFE.

The display layer PP may emit light for displaying an image. To this end, the display layer PP may include display elements configured to emit light and provide an image corresponding to the light. The display layer PP may include a display area in which an image is displayed and a non-display area that is located on at least one side of the display area.

The thin encapsulation film TFE covers the display part PP, thereby preventing or reducing instances of external moisture or oxygen flowing in the display elements. In some example embodiments of the present disclosure, the thin encapsulation film TFE may have a thickness that ranges from about 1 to 10 μm, but the present disclosure is not limited thereto.

The thin encapsulation film TFE may be a single layer, but may be multiple layers. The thin encapsulation film TFE may include multiple insulation films for covering the display elements. For example, the thin encapsulation film TFE may include multiple inorganic films and multiple organic films. For example, the thin encapsulation film TFE may have a structure in which the inorganic film and the organic film are alternately stacked. The thin encapsulation film TFE may be formed directly on the display part PP, or may be formed directly on a functional layer located on the display part PP. The thin encapsulation film TFE may be produced along with the display part PP through a continuous process.

The barrier layer BRL is located on the thin encapsulation film TFE, and may be an insulation layer for covering the thin encapsulation film TFE. The barrier layer BRL may include an inorganic insulation film including an inorganic material or an organic insulation film including an organic material.

The optical path adjustment layer FML may function to collect light emitted from one side of the display panel PNL and to guide the same to the microlens array MLA. In some example embodiments of the present disclosure, the optical path adjustment layer FML may have a thickness that is equal to or less than 400 μm, but the present disclosure is not limited thereto.

For example, the optical path adjustment layer FML may be provided between the display panel PNL and the microlens array MLA in order to space the display panel PNL and the microlens array MLA a preset (or predetermined) distance apart from each other. In some example embodiments of the present disclosure, the optical path adjustment layer FML may function as a focus matching layer for securing the field of view of a user in the wearable electronic device (100 in FIG. 1), in which the display device DP is applied, and for focusing the microlens array MLA on the eyes of the user.

The microlens array MLA may be located directly on one side of the optical path adjustment layer FML. The microlens array MLA may include a refractive index conversion layer RCL configured such that a refractive index varies from region to region. In some example embodiments of the present disclosure, the microlens array MLA may have a thickness that is equal to or less than 100 μm.

A dummy layer DML may be provided between the microlens array MLA and the optical path adjustment layer FML.

The dummy layer DML may cover the optical path adjustment layer FLM by being provided thereon and function as a protective layer for preventing external force from damaging the optical path adjustment layer FML. The dummy layer DML may be made of a transparent insulation material in order to minimize a loss of light that passes through the optical path adjustment layer FML. In an embodiment of the present disclosure, the dummy layer DML may have a thickness that is equal to or less than 100 μm, but may be omitted depending on the materials of the optical path adjustment layer FML and the microlens array MLA and on the process conditions.

The display device DP including the above-described components may be a display device having a flexible characteristic. When the display device DP has a flexible characteristic, the thin encapsulation film TFE for covering the display part PP is formed directly on the display part PP. Therefore, the thickness of the thin encapsulation film TFE is relatively thinner than a display device having a rigid characteristic. Accordingly, the thickness of the optical path adjustment layer FML may be increased in order to make the distance between the display panel PNL and the microlens array MLA equal to or greater than a certain distance.

Subsequently, referring to FIG. 8 and FIG. 11B, a display device according to some example embodiments of the present disclosure may include a display panel PNL, an optical path adjustment layer FML, a dummy layer DML, and a microlens array MLA.

The display panel PNL may include a display part PP and an encapsulation substrate CG located on the display part PP.

The display part PP may include display elements for emitting light and providing an image corresponding to the light.

The encapsulation substrate CG covers the display part PP, thereby preventing or reducing incidences of external moisture or oxygen flowing in the display elements. The encapsulation substrate CG may include a plastic substrate and/or a glass substrate. Using a sealing material located in the non-display area, in which no image is displayed, the encapsulated substrate CG may be combined with a portion of the display part PP. The encapsulation substrate CG may have a thickness that is equal to or greater than a certain value because it is formed separately from the display part PP and is then combined with the display part PP using a sealing material. In an embodiment of the present disclosure, the encapsulation substrate CG may have a thickness that is equal to or less than about 10 μm.

The display device including the above-described encapsulation substrate CG may be a display device having a rigid characteristic.

The optical path adjustment layer FML may be located on the encapsulation substrate CG. Because the encapsulation substrate CG has a thickness that is equal to or greater than a certain value in the display device DP shown in FIG. 11B, the optical path adjustment layer FML may have a thickness that is less than the thickness of the optical path adjustment layer FML of the display device DP shown in FIG. 11A. Also, according to some example embodiments, the optical path adjustment layer FML may be omitted, and the encapsulation substrate CG may replace the optical path adjustment layer FML.

Figure 12A:
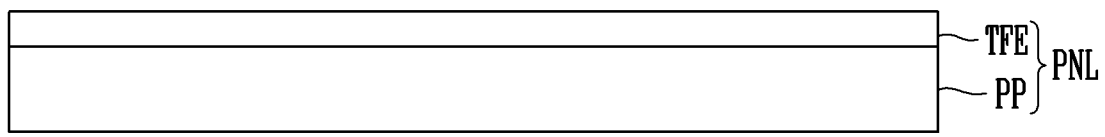
FIGS. 12A to 12F are cross-sectional views sequentially illustrating a method for fabricating the display device shown in FIG. 11A.
Figure 12B:
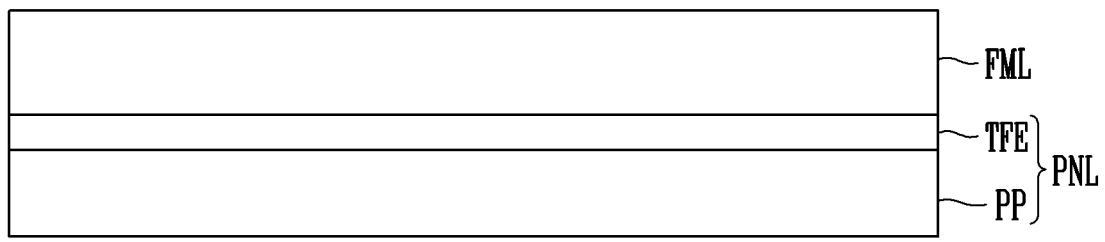
Figure 12C:
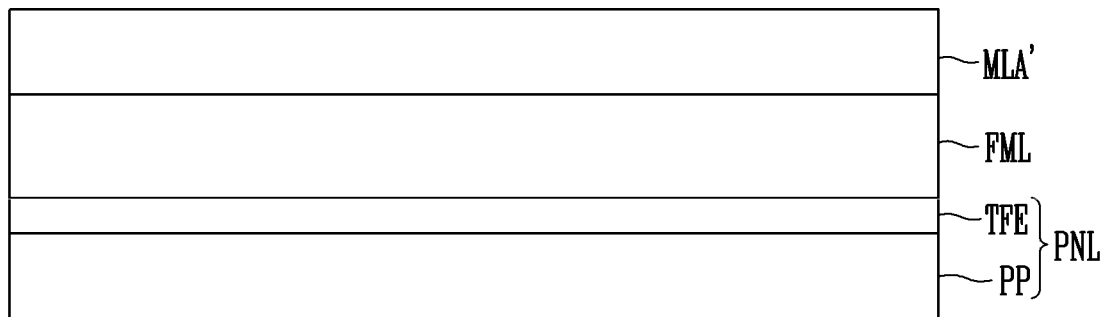
Figure 12D:
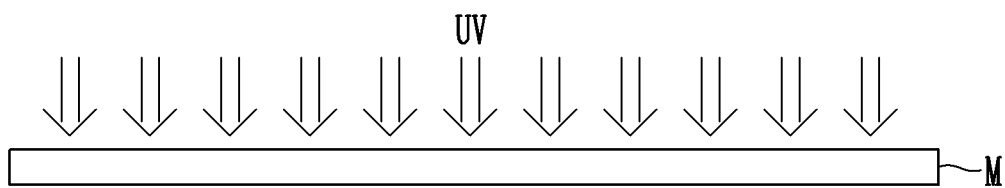
Figure 12D:
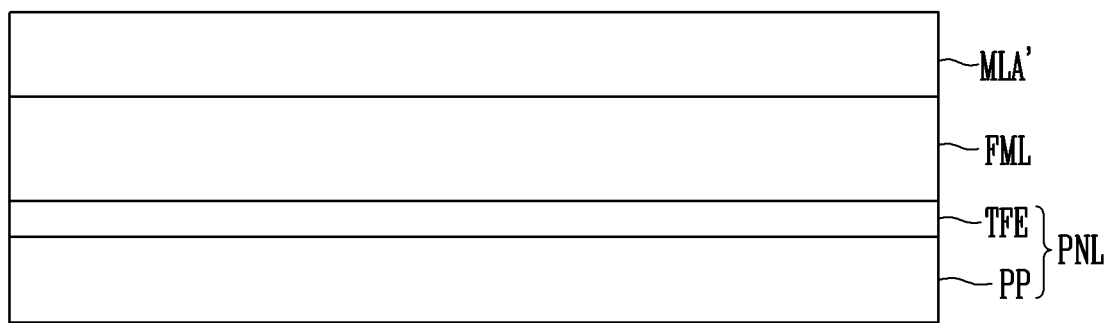
Figure 12E:
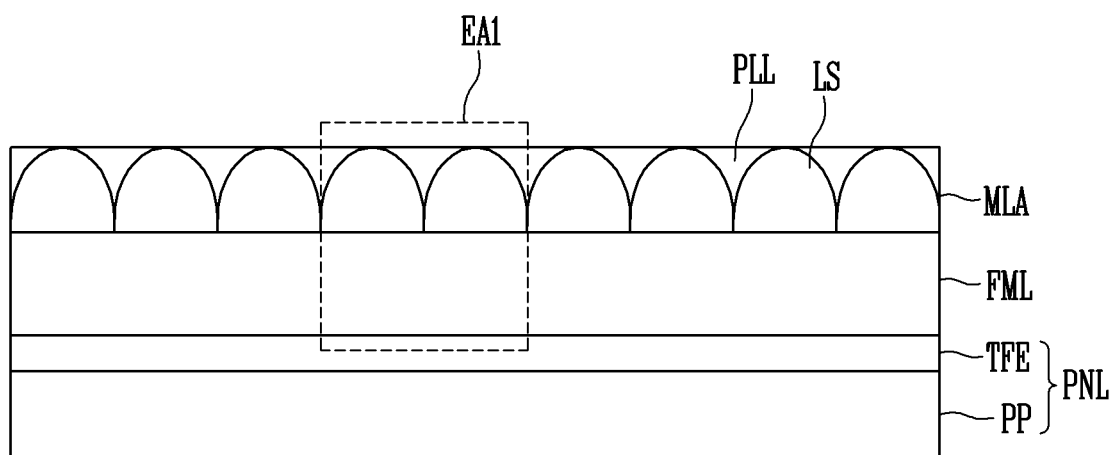
Figure 12F:
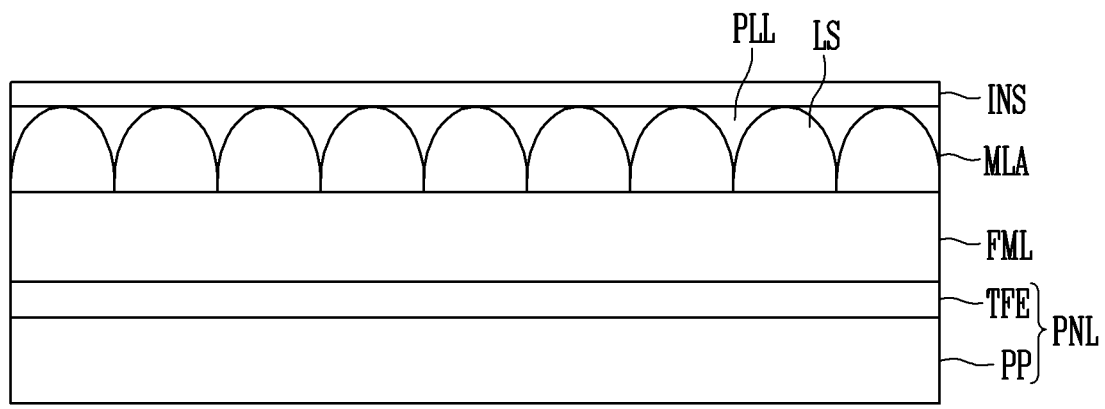
Figure 13:
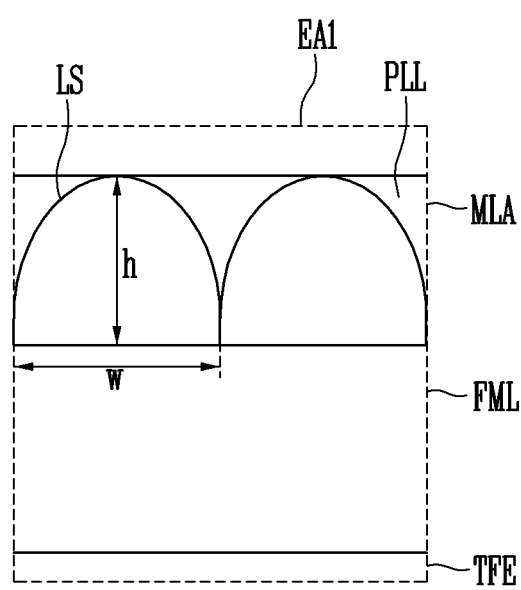
FIG. 13 is an enlarged cross-sectional view of the region EA1 shown in FIG. 12E.

FIGS. 12A to 12F are cross-sectional views sequentially illustrating a method for fabricating the display device shown in FIG. 11A, and FIG. 13 is an enlarged cross-sectional view of the region EA1 shown in FIG. 12E.

Referring to FIG. 8, FIG. 11A, and FIG. 12A, a display panel PNL, including a display part PP and a thin encapsulation film TFE formed directly on the display part PP, is arranged. The display panel PNL may emit light for displaying an image.

Referring to FIG. 8, FIG. 11A, FIG. 12A and FIG. 12B, an optical path adjustment layer FML is formed on the display panel PNL.

The optical path adjustment layer FML may function to collect light emitted from the display panel PNL. The optical path adjustment layer FML may include any one of a silicon-based material, an optically transparent adhesive material, and a transparent optical resin, and may have a thickness that is equal to or less than about 400 μm.

Referring to FIG. 8, FIG. 11A, and FIGS. 12A to FIG. 12C, a microlens array material layer MLA' is formed on the optical path adjustment layer FML.

The microlens array material layer MLA' may include a mixture layer (MXL in FIG. 10A), in which liquid crystal molecules LCM and UV-curable monomers (MON in FIG. 10A) are mixed, and a lower electrode LE and an upper electrode UE between which the mixture layer MXL is present.

The method for fabricating the microlens array material layer MLA' configured as described above is as follows.

A lower electrode LE made of a transparent conductive material is formed on the optical path adjustment layer FML. Then, a mixture layer MXL in which liquid crystal molecules LCM and UV-curable monomers are included is formed on the lower electrode LE. Then, an upper electrode UE made of the same material as the lower electrode LE is formed on the mixture layer MXL.

Referring to FIG. 8, FIG. 11A, and FIGS. 12A to 12D, a mask M is arranged above the microlens array material layer MLA', and ultraviolet light is selectively radiated to the microlens array material layer MLA' using the mask M.

The mask M may include multiple openings and blocking parts provided therebetween. The openings may transmit ultraviolet light, but the blocking parts may block the ultraviolet light. The respective openings may have different sizes.

Referring to FIG. 8, FIG. 11A, FIGS. 12A to 12E, and FIG. 13, when ultraviolet light is radiated to the microlens array material layer MLA', the UV-curable monomers MON in the microlens array material layer MLA' react to the ultraviolet light, thereby forming a crosslinked polymer network PLN.

Accordingly, a microlens array MLA having a refractive index conversion layer RCL, which includes the polymer network PLN, formed through radiation of ultraviolet light, and liquid crystal molecules, the movement of which is limited by the polymer network PLN, may be formed.

In the refractive index conversion layer RCL, the density of the polymer network in the region to which a large amount of ultraviolet light is radiated may differ from the density of the polymer network in the region to which a small amount of ultraviolet light is radiated. The different density of the polymer network PLN in the respective regions affects the refractive indices of the liquid crystal molecules LCM that interact with the polymer network PLN, whereby the microlens array MLA in which a refractive index varies from region to region may be finally realized.

In some example embodiments of the present disclosure, the polymer network PLN and the liquid crystal molecules LCM that interact with the polymer network PLN may form a lens shape LS. The lens shape LS may be provided as multiple lens shapes in the microlens array MLA. Also, the microlens array MLA may include a planar part PLL for covering the lens shapes LS. The refractive index of each of the lens shapes LS and the refractive index of the planar part PLL may differ from each other. In some example embodiments of the present disclosure, the planar part PLL may indicate the region remaining after the lens shapes LS are excluded from the refractive index conversion layer RCL, and may have a constant refractive index, as opposed to the lens shapes LS.

Each of the lens shapes LS may have a curved surface, the cross-section of which is the shape of a semicircle, a semi-ellipse, or the like, the width of which becomes narrower as coming close to the upper part thereof from one side of the optical path adjustment layer FML, as shown in FIG. 13. When each of the lens shapes LS has a curved surface, the cross section of which is the shape of a semicircle, each of the lens shapes LS may have a radius that is equal to or less than 0.5 μm.

In some example embodiments of the present disclosure, each of the lens shapes LS may have a height h that is equal to or less than 0.5 μm and a width w that is equal to or less than 5 μm, but the present disclosure is not limited thereto. Because the height h and the width w of each of the lens shapes LS vary depending on the amount of ultraviolet light radiated to the microlens array material layer MLA', the height h and the width w of each of the lens shapes LS may be easily controlled.

Referring to FIG. 8, FIG. 11A, and FIGS. 12A to 12F, an insulation layer INS may be formed on the microlens array MLA. The insulation layer INS may cover the microlens array MLA and function as a protective layer for preventing external force from damaging the microlens array MLA. According to some example embodiments, the insulation layer INS may be omitted.

As described above, the display device DP according to some example embodiments of the present disclosure forms the microlens array MLA directly on the display panel PNL, thereby minimizing or reducing an alignment error when the microlens array MLA is combined with the display panel PNL. For example, the display device DP according to some example embodiments of the present disclosure may reduce defects attributable to misalignment, compared to an existing display device in which a display panel PNL and a microlens array MLA, which are produced through separate processes, are aligned and bonded through a bonding process.

Also, the display device DP according to some example embodiments of the present disclosure uses a refractive index conversion layer RCL, which includes a polymer network PLN and liquid crystal molecules LCM interacting with the polymer network PLN, as a lens, thereby implementing a microlens array MLA in which a refractive index varies from region to region. That is, the microlens array MLA may use the refractive index conversion layer RCL as a lens without special microlenses.

When the display device DP including the above-described microlens array MLA is applied in a wearable electronic device (100 in FIG. 1), the refractive index conversion layer RCL of the microlens array MLA may collect light emitted from the display panel PNL and collimate the same so as to be delivered to the eyes of a user who wears the wearable electronic device 100. Consequently, the display device DP according to some example embodiments of the present disclosure may provide virtual reality or augmented reality to the user who wears the wearable electronic device 100 although it does not include special microlenses.

The display device DP according to the above-described embodiments of the present disclosure may be implemented so as to be slim because a microlens array MLA does not include special microlenses.

Figure 14A:
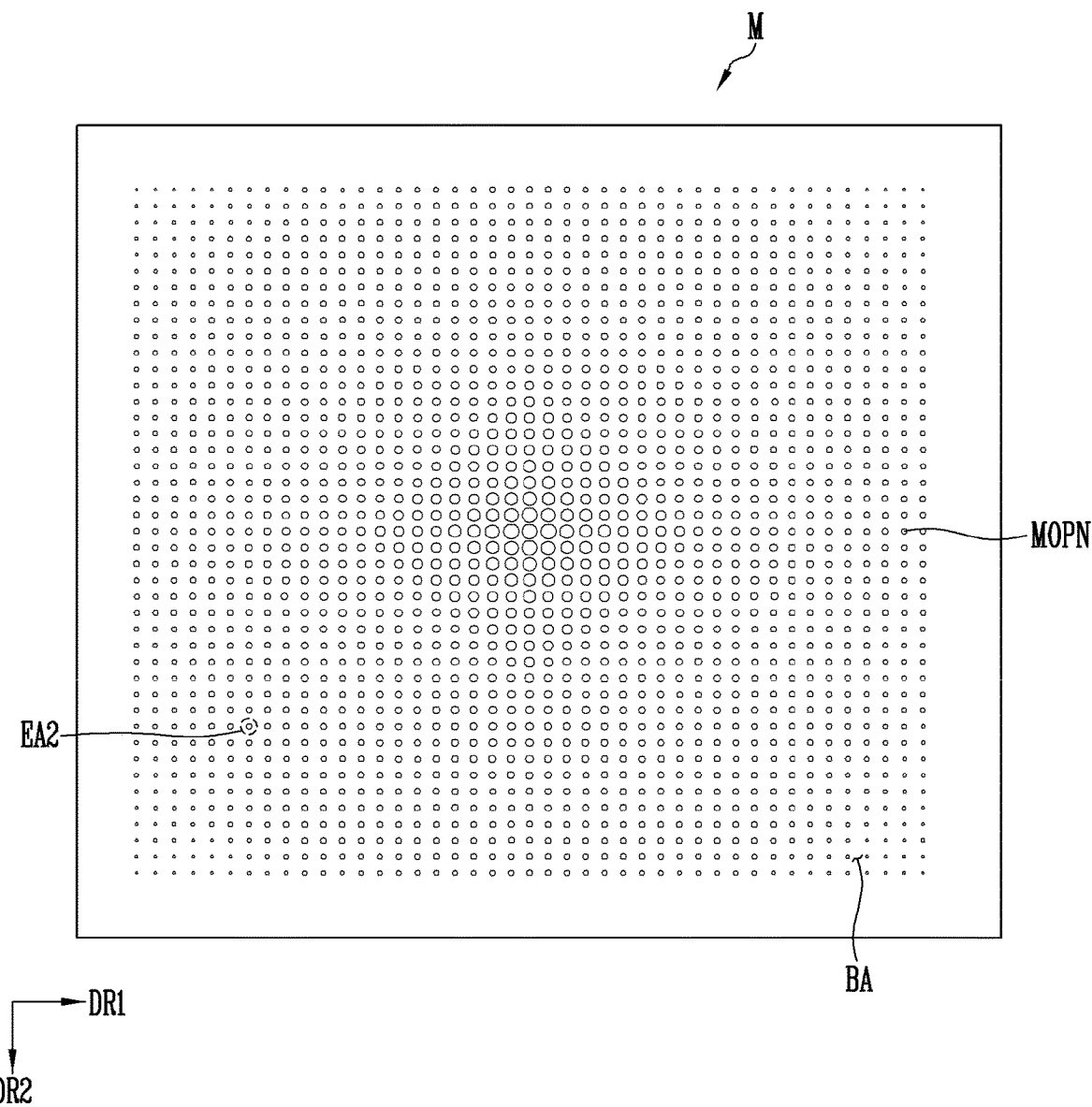
FIG. 14A is a top plan view schematically illustrating the mask shown in FIG. 12D.
Figure 14B:
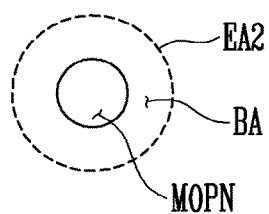
FIG. 14B is an enlarged top plan view of the region EA2 shown in FIG. 14A.
Figure 15:
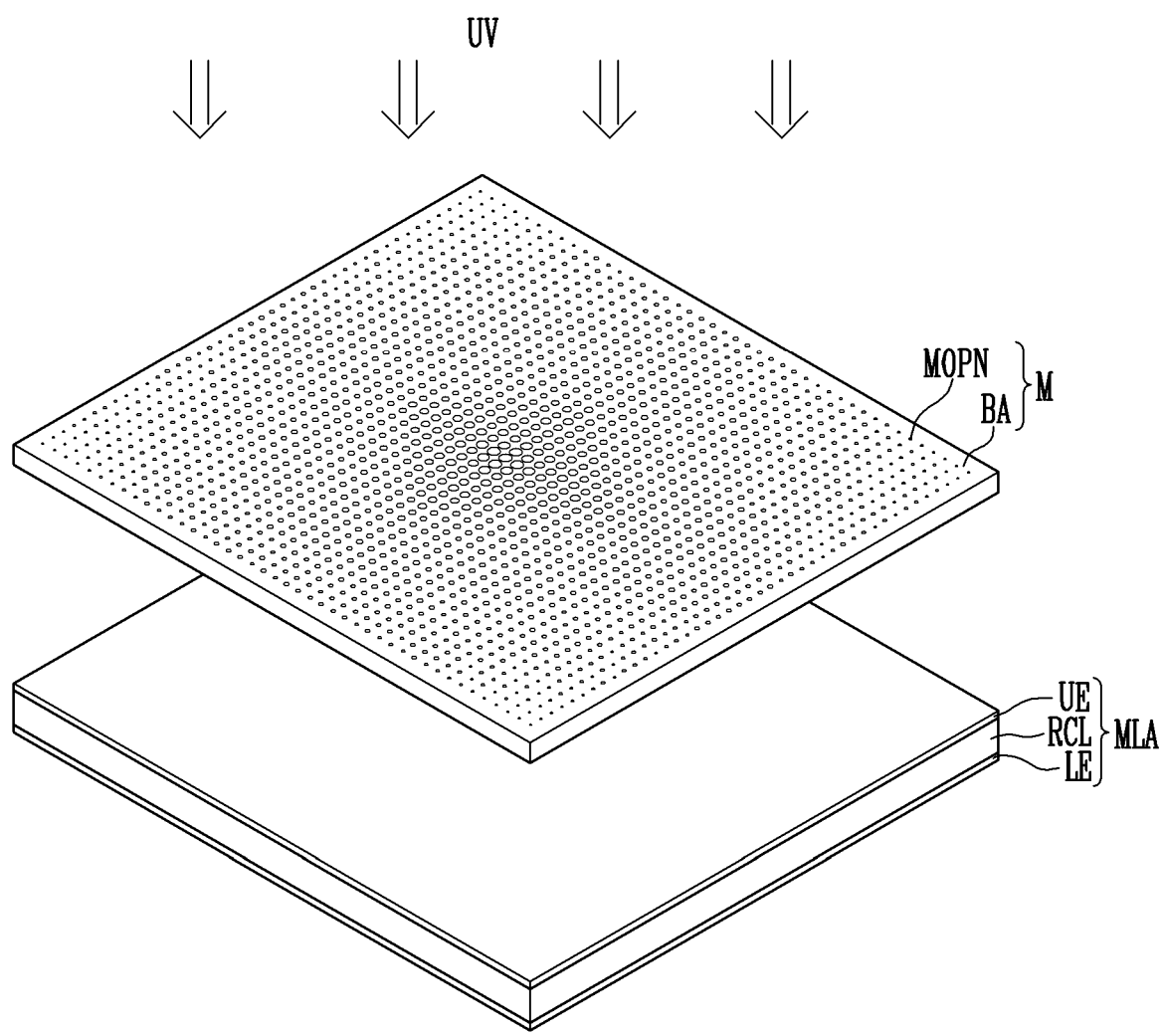
FIG. 15 is a perspective view illustrating a method for forming a microlens array using the mask shown in FIG. 14A according to some example embodiments.
Figure 16:
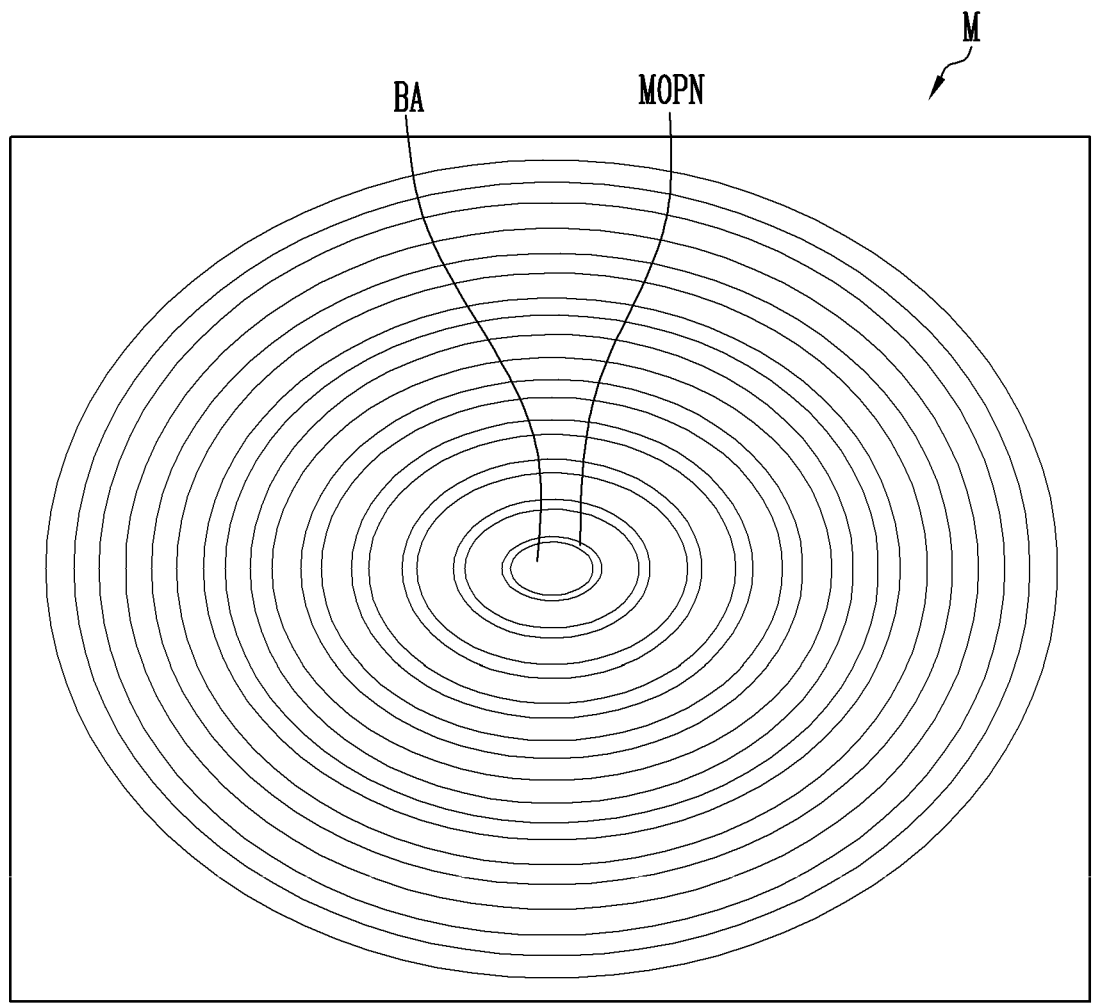
FIG. 16 is a top plan view illustrating another form of the mask shown in FIG. 14A.

FIG. 14A is a top plan view schematically illustrating the mask shown in FIG. 12D, FIG. 14B is an enlarged top plan view of the region EA2 shown in FIG. 14A, FIG. 15 is a perspective view illustrating a method for forming a microlens array using the mask shown in FIG. 14A according to some example embodiments of the present disclosure, and FIG. 16 is a top plan view illustrating another form of the mask shown in FIG. 14A.

Referring to FIG. 12D, FIG. 14A, FIG. 14B, FIG. 15 and FIG. 16, a microlens array MLA according to some example embodiments of the present disclosure may include a refractive index conversion layer RCL that is formed by arranging a mask M above the microlens array MLA and by radiating ultraviolet light thereto.

In some example embodiments of the present disclosure, the mask M may include multiple openings MOPN and blocking parts BA located therebetween. The openings MOPN transmit ultraviolet light, but the blocking parts BA block the ultraviolet light. In an embodiment of the present disclosure, the openings MOPN may have different sizes.

The openings MOPN may be arranged along the rows extending in a first direction DR1 and along the columns extending in a second direction DR2, which is perpendicular to the first direction DR1, so as to be in the form of a matrix, as shown in FIG. 14A and FIG. 15, but the present disclosure is not limited thereto.

In some example embodiments of the present disclosure, each of the openings MOPN may have a dot shape, but the present disclosure is not limited thereto. According to some example embodiments, each of the openings MOPN may have a ring shape, as shown in FIG. 16. The shape of each of the openings MOPN is not limited to the above-described embodiments, and may be variously changed as long as it is possible to form a refractive index conversion layer RCL in which a refractive index varies from region to region.

When each of the openings MOPN has a dot shape, the size thereof may be equal to or greater than about 1 μm. As shown in FIG. 14A and FIG. 15, when each of the openings MOPN has a dot shape, the size of thereof may be decreased as the location thereof is closer to the borders of the mask M from the center thereof. Also, according to some example embodiments, the size of each of the openings MOPN may be decreased as the location thereof is closer to the center of the mask M from the borders thereof.

According to some example embodiments, when each of the openings MOPN has a ring shape, the ring width thereof may be increased as the location thereof is closer to the borders of the mask M from the center thereof, as shown in FIG. 16. In this case, the sizes of the blocking parts BA located therebetween may also differ from each other. For example, the width of each of the blocking parts BA may be narrower as the location thereof is closer to the borders of the mask M from the center thereof.

Also, when each of the openings MOPN has a ring shape, the ring width thereof may be increased as the location thereof is closer to the center of the mask M from the borders thereof. In this case, the width of each of the blocking parts BA located between the openings MOPN may be narrower as the location thereof is closer to the center of the mask M from the borders of the mask M.

As described above, because the openings MOPN included in the mask M have different sizes, the amount of ultraviolet light radiated to the microlens array MLA after passing through each of the openings MOPN may vary depending on the size of the corresponding opening MOPN.

For example, because the openings MOPN located at the center of the mask M have larger sizes than the openings MOPN located at the borders of the mask M, as shown in FIG. 14A and FIG. 15, a greater amount of ultraviolet light may be radiated to a certain region of the refractive index conversion layer RCL that corresponds to the center of the mask M. Also, a less amount of ultraviolet light may be radiated to a certain region of the refractive index conversion layer RCL that corresponds to the border of the mask M, compared to the region of the refractive index conversion layer RCL corresponding to the center of the mask M.

As described above, because the amount of ultraviolet light radiated to a certain region of the refractive index conversion layer RCL is changed depending on the size of the opening MOPN in the mask M corresponding thereto, the density of the polymer network (PLN in FIG. 8) in the refractive index conversion layer RCL may vary depending on the region. Because the density of the polymer network PLN varies from region to region, the refractive index of the liquid crystal molecules (LCM in FIG. 8) that interact with the polymer network PLN may also vary from region to region. Accordingly, the refractive index conversion layer RCL has a different refractive index from region to region, thereby functioning as the lens of a microlens array MLA.

Through the refractive index conversion layer RCL functioning as a lens, the microlens array MLA may collimate light emitted from the display panel PNL so as to be delivered to a specific area although it does not include special microlenses.

According to some example embodiments of the present disclosure, a slim display device having improved display quality and a fabrication method thereof may be provided.

Although aspects of some example embodiments of the present disclosure have been disclosed for illustrative purposes, those skilled in the art will appreciate that various modifications, additions and substitutions are possible, without departing from the scope and spirit of the disclosure as disclosed in the accompanying claims, and their equivalents. Therefore, the technical scope of the present disclosure should be defined by the technical spirit of the claims, and their equivalents, rather than the detailed description.

What is claimed is:

1. A method for fabricating a display device, comprising:
   forming a display configured to emit light for displaying an image; and
   forming a microlens array including a refractive index conversion layer, in which a refractive index varies from region to region, on the display,
   wherein forming the microlens array comprises:
   forming a lower electrode, made of a transparent conductive material, on the display;
   coating the lower electrode with a mixture layer in which UV-curable monomers and liquid crystal molecules are mixed;
   forming an upper electrode, made of a same material as the lower electrode, on the mixture layer; and
   arranging a mask on the upper electrode and radiating ultraviolet light to the mixture layer, thereby forming the refractive index conversion layer including a polymer network, crosslinked by the ultraviolet light, and the liquid crystal molecules interacting with the polymer network.

2. The method according to claim 1, wherein, in the refractive index conversion layer, a content of the polymer network is equal to or higher than 0.01%.

3. The method according to claim 2, wherein:
the mask includes multiple openings through which the ultraviolet light passes such that the ultraviolet light reaches the refractive index conversion layer, and
each of the openings includes any one of a dot shape and a ring shape.

4. The method according to claim 3, wherein the multiple openings have different sizes.

5. The method according to claim 1, wherein, in the refractive index conversion layer, a density of the polymer network varies depending on an amount of the radiated ultraviolet light.

6. The method according to claim 5, wherein the density of the polymer network in a region to which a large amount of the ultraviolet light is radiated is higher than that in a region to which a small amount of ultraviolet light is radiated.

7. The method according to claim 6, wherein the liquid crystal molecules and the polymer network, densities of which vary from region to region, form a lens shape in the refractive index conversion layer.

8. The method according to claim 7, wherein the refractive index conversion layer is configured such that a refractive index in a region in which the densities of the polymer network and the liquid crystal molecules are high is higher than a refractive index in a region in which the densities of the polymer network and the liquid crystal molecules are low.

9. The method according to claim 8, wherein:
the refractive index conversion layer further includes an additive material for arrangement of the liquid crystal molecules, and
the additive material includes an alignment material.

10. The method according to claim 1, further comprising:
forming an optical path adjustment layer on the display, the optical path adjustment layer being configured to collect light, emitted from the display and transmitted by the microlens array, and to space the display and the microlens array a preset distance apart from each other.

11. The method according to claim 10, wherein the optical path adjustment layer is formed between the display and the microlens array.

12. The method according to claim 11, wherein the optical path adjustment layer includes any one of a silicon-based material, an optically transparent adhesive material, and a transparent optical resin.

13. The method according to claim 11, wherein the display comprises:
a substrate including a display area and a non-display area, the display area being configured to display the image and the non-display area being configured to surround at least one side of the display area;
a pixel circuit on the substrate and including at least one transistor; and
a display element layer including at least one light-emitting element that is electrically coupled to the transistor and configured to emit the light.

14. The method according to claim 13, further comprising:
forming an encapsulation layer between the display and the optical path adjustment layer.

15. The method according to claim 14, wherein the encapsulation layer includes any one of an encapsulation substrate and a thin encapsulation film, each of which is configured to cover the display element layer.

16. The method according to claim 15, further comprising:
forming a protective layer between the optical path adjustment layer and the microlens array.

* * * * *